United States Patent
Sung et al.

(10) Patent No.: US 12,364,087 B2
(45) Date of Patent: Jul. 15, 2025

(54) WIRING SUBSTRATE AND DISPLAY DEVICE INCLUDING THE SAME

(71) Applicant: Samsung Display Co., LTD., Yongin-si (KR)

(72) Inventors: Hyun Ah Sung, Suwon-si (KR); Dong Min Lee, Anyang-si (KR); Young Rok Kim, Anyang-si (KR); Kyu Soon Park, Yongin-si (KR); Joon Yong Park, Gunpo-si (KR); Hyun Eok Shin, Gwacheon-si (KR); Jong Hyun Choung, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 471 days.

(21) Appl. No.: 17/963,659

(22) Filed: Oct. 11, 2022

(65) Prior Publication Data

US 2023/0163158 A1 May 25, 2023

(30) Foreign Application Priority Data

Nov. 23, 2021 (KR) .................. 10-2021-0161849

(51) Int. Cl.
*H10H 29/14* (2025.01)
*H10H 20/821* (2025.01)
*H10H 20/84* (2025.01)

(52) U.S. Cl.
CPC ........ *H10H 29/142* (2025.01); *H10H 20/821* (2025.01); *H10H 20/84* (2025.01)

(58) Field of Classification Search
CPC ..... H10H 20/821; H10H 20/84; H10H 29/142
See application file for complete search history.

(56) References Cited

U.S. PATENT DOCUMENTS

2014/0197382 A1 7/2014 Kim et al.
2014/0311769 A1* 10/2014 In .................. C22F 1/08
428/615

(Continued)

OTHER PUBLICATIONS

Kun Hee Lee, Wonhyo Kong, Myeongjin Han, Da Jung Park, Jee Hyuk Ahn, Seung Zeon Han, Young-Bae Park, Kyu Hwan Lee, Seunghoe Choe, Properties of nanocrystalline CuAg foil prepared via electrodeposition, Journal of Alloys and Compounds, vol. 881, 2021 (Year: 2021).*

(Continued)

*Primary Examiner* — Mark W Tornow
(74) *Attorney, Agent, or Firm* — Womble Bond Dickinson (US) LLP

(57) ABSTRACT

A display device includes a first substrate including a display area and a pad area, which is on one side of the display area, a plurality of conductive layers each including a plurality of wires and conductive patterns, which are in the display area and the pad area, on the first substrate, a via layer on the plurality of conductive layers, a first electrode and a second electrode on the via layer, in the display area, to be spaced apart from each other, a first insulating layer on the first electrode and the second electrode, a plurality of light-emitting elements on the first electrode, the second electrode, and on the first insulating layer, and a first connecting electrode on the first electrode and in contact with the plurality of light-emitting elements, and a second connecting electrode on the second electrode and in contact with the plurality of light-emitting elements, wherein at least one of the plurality of conductive layers includes a metal layer, which includes a copper-silver (CuAg) alloy and has a crystal grain size of 140 nm or less.

20 Claims, 29 Drawing Sheets

(56) References Cited

U.S. PATENT DOCUMENTS

| | | | |
|---|---|---|---|
| 2022/0069167 A1* | 3/2022 | Lee | H10H 20/8312 |
| 2022/0310895 A1* | 9/2022 | Kim | H01L 25/0753 |
| 2022/0406817 A1* | 12/2022 | Park | H10D 86/021 |
| 2023/0163158 A1* | 5/2023 | Sung | H10H 29/142 |
| | | | 257/89 |

OTHER PUBLICATIONS

Barmak, et al., "Annealing Behavior of Cu and Dilute Cu Alloy Films: Precipitation, Grain Growth, and Resistivity," J. Appl. Phys. 94(3), Aug. 1, 2003; p. 1605-1616.

* cited by examiner

WIRING SUBSTRATE AND DISPLAY DEVICE INCLUDING THE SAME

CROSS-REFERENCE TO RELATED APPLICATION

This application claims priority to and the benefit of Korean Patent Application No. 10-2021-0161849 filed on Nov. 23, 2021 in the Korean Intellectual Property Office, the entire content of which is herein incorporated by reference.

BACKGROUND

1. Field

One or more embodiments of the present disclosure relate to a wiring substrate and a display device including the same.

2. Description of the Related Art

Display devices are becoming more important with developments in multimedia technology. Accordingly, various display devices such as an organic light-emitting diode (OLED) display device, a liquid crystal display (LCD) device, and/or the like are being developed and used.

Among display devices are self-luminous display devices including light-emitting elements. Examples of the self-luminous display devices include an organic light-emitting display device using an organic material as a light-emitting material and an inorganic light emitting display device using an inorganic material as a light-emitting material.

SUMMARY

One or more aspects of embodiments of the present disclosure provide a wiring substrate having suitably smooth surfaces and improved straightness and a display device including the wiring substrate.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the disclosure, a display device comprises a first substrate including a display area and a pad area on one side of the display area, a plurality of conductive layers, each of the plurality of conductive layer including a plurality of wires and conductive patterns, which are in the display area and the pad area, on the first substrate, a via layer on the plurality of conductive layers, a first electrode and a second electrode on the via layer, in the display area, to be spaced apart from each other, a first insulating layer on the first electrode and the second electrode, a plurality of light-emitting elements on the first electrode and the second electrode, on the first insulating layer, and a first connecting electrode on the first electrode and in contact with the plurality of light-emitting elements, and a second connecting electrode on the second electrode and in contact with the light-emitting elements, wherein at least one of the plurality of conductive layers includes a metal layer, which includes a copper-silver (CuAg) alloy and has a crystal grain size of 140 nm or less.

In one or more embodiments, the metal layer has a specific resistivity of 2.3 $\mu\Omega$cm or less.

In one or more embodiments, the metal layer has an Ag content of 3 at % or less.

In one or more embodiments, the metal layer has an Ag content of 1 at % or less.

In one or more embodiments, the metal layer has a thickness of 2000 Å to 20000 Å.

In one or more embodiments, the metal layer has a thickness of about 8000 Å and a surface resistivity of 0.02 $\Omega$/square to 0.03 $\Omega$/square.

In one or more embodiments, the metal layer has a thickness of about 3000 Å and a surface resistivity of 0.06 $\Omega$/square to 0.08 $\Omega$/square.

In one or more embodiments, the metal layer has a line edge roughness (LER) of 0.195 $\mu$m or less.

In one or more embodiments, the conductive layers include a first conductive layer, which includes a lower metal layer in the display area and a first pad wire in the pad area, a second conductive layer, which is on the first conductive layer and includes a plurality of gate electrodes in the display area and a second pad wire in the pad area, and a third conductive layer, which is on the second conductive layer and includes a first conductive pattern in the display area and a pad electrode lower layer in the pad area, and wherein the via layer is on the third conductive layer, in the display area.

In one or more embodiments, the display device further comprises a first gate insulating layer between the first conductive layer and the second conductive layer, a first interlayer insulating layer between the second conductive layer and the third conductive layer, a first passivation layer on the third conductive layer, a pad electrode upper layer on the pad electrode lower layer, in the pad area, and a pad electrode capping layer on the pad electrode upper layer, wherein the first gate insulating layer, the first interlayer insulating layer, and the first passivation layer include an inorganic insulating material.

In one or more embodiments, the pad electrode upper layer includes the same material as the first electrode and the second electrode, and the pad electrode capping layer includes the same material as the first connecting electrode and the second connecting electrode.

In one or more embodiments, the plurality of conductive layers further include a fourth conductive layer, which is on the third conductive layer and includes a first voltage line and a second voltage line, and the display device further comprises a second interlayer insulating layer on the first passivation layer, and a second passivation layer on the fourth conductive layer.

In one or more embodiments, the via layer includes a trench, which exposes portion of a top surface of the second passivation layer, at least portions of the first electrode and the second electrode are directly on the second passivation layer, in the trench, and the plurality of light-emitting elements are provided in the trench.

According to one or more embodiments of the disclosure, a wiring substrate comprises a plurality of conductive layers, each of the plurality of conductive layers including a plurality of wires and conductive patterns, which are on a substrate, and at least one insulating layer between respective ones of the plurality of conductive layers, wherein at least one of the plurality of conductive layers includes a metal layer, which includes a copper-silver (CuAg) alloy and has a crystal grain size of 140 nm or less and a specific resistivity of 2.3 $\mu\Omega$cm or less.

In one or more embodiments, the metal layer has an Ag content of 3 at % or less.

In one or more embodiments, the metal layer has an Ag content of 1 at % or less.

In one or more embodiments, the metal layer has a thickness of 2000 Å to 20000 Å.

In one or more embodiments, the metal layer has a thickness of about 8000 Å and a surface resistivity of 0.02 Ω/square to 0.03 Ω/square.

In one or more embodiments, the metal layer has a thickness of about 3000 Å and a surface resistivity of 0.06 Ω/square to 0.08 Ω/square.

In one or more embodiments, the metal layer has a line edge roughness (LER) of 0.195 μm or less.

According to the aforementioned and other embodiments of the present disclosure, as wires and conductive patterns of a plurality of conductive layers of a wiring substrate include a Cu alloy having a small crystal grain size, the wiring substrate can have suitably smooth surfaces and improved straightness.

Also, as a display device includes the wiring substrate, step coverage defects in insulating layers between the conductive layers can be reduced, and short circuits and burnt defects that may occur between the wires can be prevented or reduced.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
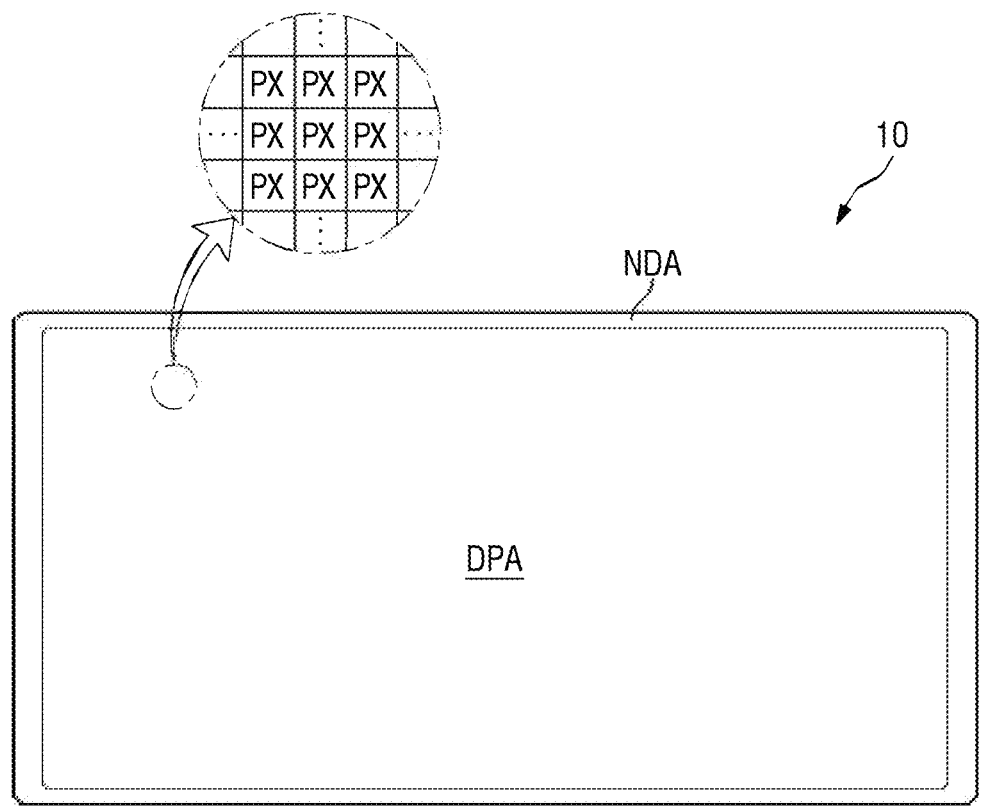
FIG. 1 is a plan view of a display device according to one or more embodiments of the present disclosure.

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate (e.g., without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. For example, "at least one of a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items.

Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, For example, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Each of the features of the various embodiments of the present disclosure may be combined or combined with each other, in part or in whole, and technically suitable interlockings, variations, and driving are possible. Each embodiment may be implemented independently of each other or may be implemented together in an association.

Embodiments of the present disclosure will hereinafter be described with reference to the accompanying drawings.

FIG. 1 is a plan view of a display device according to one or more embodiments of the present disclosure.

Referring to FIG. 1, a display device 10 displays a moving and/or still image. The display device 10 may refer to nearly all types (or kinds) of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the present disclosure is not limited thereto. For example, various other display panels are also applicable to the display panel of the display device 10.

The shape of the display device 10 may vary. For example, the display device 10 may have a rectangular shape that extends longer in a horizontal direction than in a vertical direction, a rectangular shape that extends longer in the vertical direction than in the horizontal direction (e.g., is elongated in the vertical direction), a square shape, a tetragonal shape with rounded corners, a non-tetragonal polygonal shape, and/or a circular shape. The shape of a display area DPA of the display device 10 may be similar to the shape of the display device 10. FIG. 1 illustrates that the display device 10 and the display area DPA both have a rectangular shape that extends in a second direction DR2.

The display device 10 may include the display area DPA and a non-display area NDA. The display area DPA may be an area in which a screen (e.g., image) is displayed, and the non-display area NDA may be an area in which a screen (e.g., image) is not displayed. The display area DPA may also be referred to as an active area, and the non-display area NDA may also be referred to as an inactive area. The display area DPA may occupy substantially the middle portion of the display device 10.

The display area DPA may include a plurality of pixels PX. The pixels PX may be arranged in row and column directions. Each of the pixels PX may have a rectangular or square shape in a plan view, but the present disclosure is not limited thereto. In some embodiments, each of the pixels PX may have a rhombus shape having sides inclined with respect to a particular direction. The pixels PX may be arranged in a stripe fashion or an island fashion. Each of the pixels PX may include one or more light-emitting elements, which emit light of a set or particular wavelength range.

The non-display area NDA may be provided around the display area DPA. The non-display area NDA may surround the entire display area DPA or a portion of the display area DPA. The display area DPA may have a rectangular shape, and the non-display area NDA may be provided adjacent to four sides of the display area DPA. The non-display area NDA may form the bezel of the display device 10. Lines and/or circuit drivers included in the display device 10 may be provided in the non-display area NDA, and/or external devices may be mounted in the non-display area NDA.

Figure 2:
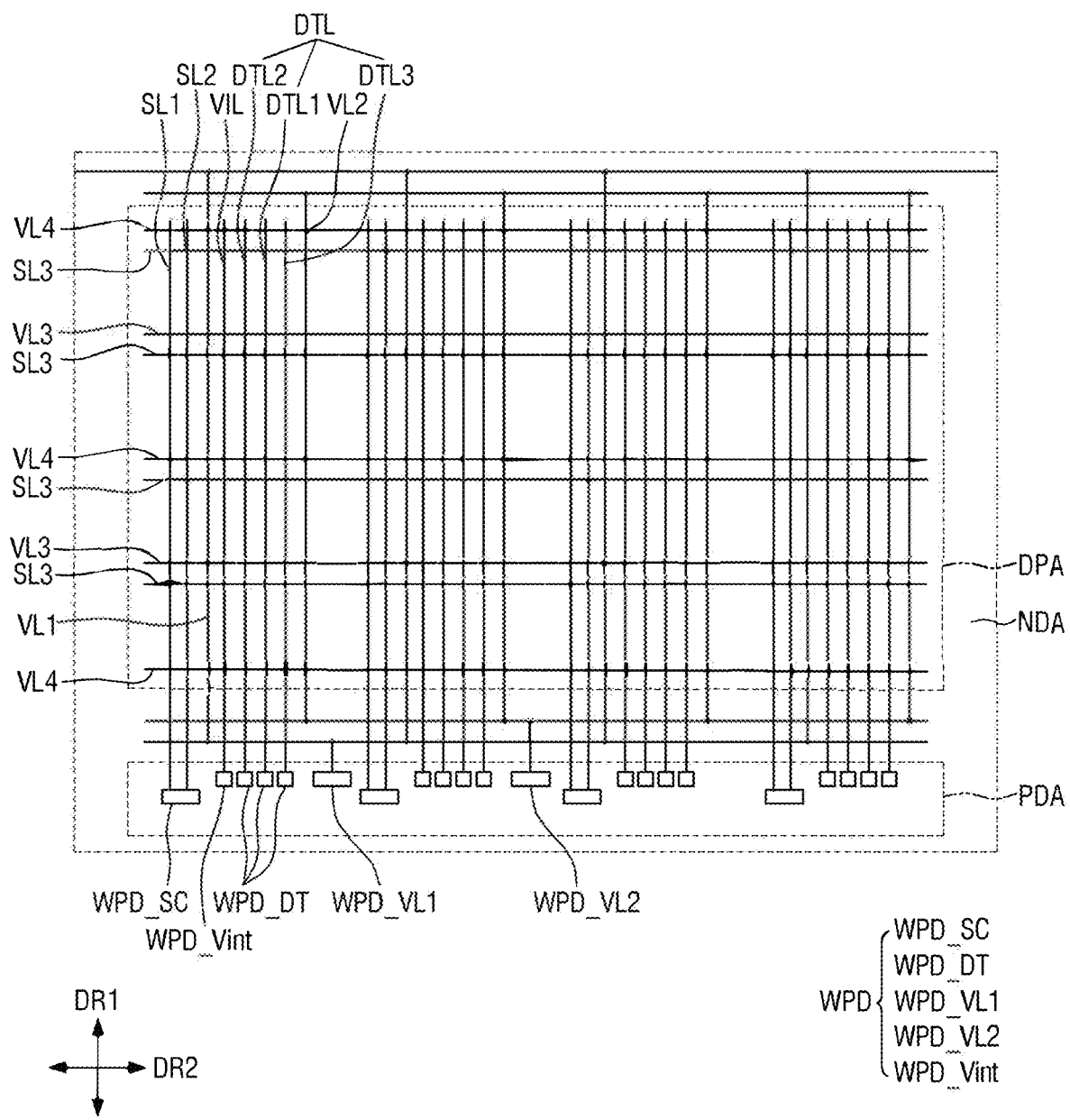
FIG. 2 is a plan view illustrating the layout of a plurality of lines included in the display device of FIG. 1.

FIG. 2 is a plan view illustrating the layout of a plurality of lines included in the display device of FIG. 1.

Referring to FIG. 2, the display device 10 may include a plurality of lines. The display device 10 may include a plurality of scan lines SL, a plurality of data lines DTL, initialization voltage lines VIL, and a plurality of voltage lines VL. In one or more embodiments, the display device 10 may further include other lines.

First scan lines SL1 and second scan lines SL2 may extend in the first direction DR1. A set of first and second scan lines SL1 and SL2 may be provided adjacent to each other and may be spaced apart from other sets of first and second scan lines SL1 and SL2 in the second direction DR2. The first scan lines SL1 and the second scan lines SL2 may be connected (e.g., electrically coupled) to scan line wire pads WPD_SC, which are connected (e.g., electrically coupled) to a scan driver. The first scan lines SL1 and the second scan lines SL2 may extend from a pad area PDA in the non-display area NDA toward the display area DPA.

Third scan lines SL3 may extend in the second direction DR2 and may be spaced apart from one another in the first direction DR1. Each of the third scan lines SL3 may be connected to one or more first scan lines SL1 or one or more second scan lines SL2. The first scan lines SL1 and the second scan lines SL2 may be formed of a different conductive layer from the third scan lines SL3. The scan lines SL may form a mesh structure over the entire display area DPA, but the present disclosure is not limited thereto.

The term "connect" or "connection", as used herein, not only means that one element is coupled to another element through physical contact, but also means that one element is coupled to another element via yet another element. One integral member may be understood as having parts connected to one another. Also, the connection between two elements may encompass not only a direct connection between the two elements, but also an electrical connection between the two elements.

The data lines DTL may extend in the first direction DR1. The data lines DTL may include first data lines DTL1, second data lines DTL2, and third data lines DTL3, and one first data line DTL1, one second data line DTL2, and one third data line DTL3 may be paired (e.g., combined) together to be provided adjacent to one another. The data lines DTL may extend from the pad area PDA in the non-display area NDA toward the display area DPA. However, the present disclosure is not limited to this. In some embodiments, the data lines DTL may be arranged at equal (e.g., substantially equal) intervals between first voltage lines VL1 and second voltage lines VL2.

The initialization voltage lines VIL may extend in the first direction DR1. The initialization voltage lines VIL may be provided between the data lines DTL, the first scan lines SL1, and the second scan lines SL2. The initialization voltage lines VIL may extend from the pad area PDA in the non-display area NDA toward the display area DPA.

The first voltage lines VL1 and the second voltage lines VL2 may extend in the first direction DR1, and third voltage lines VL3 and fourth voltage lines VL4 may extend in the second direction DR2. The first voltage lines VL1 and the second voltage lines VL2 may be alternately arranged with each other in the second direction DR2, and the third voltage lines VL3 and the fourth voltage lines VL4 may be alternately arranged with each other in the first direction DR1. The first voltage lines VL1 and the second voltage lines VL2 may extend in the first direction DR1 across the display area DPA. Some of the third voltage lines VL3 and some of the fourth voltage lines VL4 may be provided in the display area DPA, and other third voltage lines VL3 and other fourth voltage lines VL4 may be provided in the non-display area NDA, on both sides, in the first direction DR1, of the display area DPA. The first voltage lines VL1 and the second voltage lines VL2 may be formed of a different conductive layer from the third voltage lines VL3 and the fourth voltage lines VL4. Each of the first voltage lines VL1 may be connected (e.g., electrically coupled) to one or more third voltage lines VL3, and each of the second voltage lines VL2 may be connected (e.g., electrically coupled) to one or more fourth voltage lines VL4. The voltage lines VL may form a mesh structure over the entire display area DPA, but the present disclosure is not limited thereto.

Each of the first scan lines SL1, the second scan lines SL2, the data lines DTL, the initialization voltage lines VIL, the first voltage lines VL1, and the second voltage lines VL2 may be electrically connected to one or more wire pads WPD. The wire pads WPD may be provided in the non-display area NDA. The wire pads WPD may also be provided in the pad area PDA on a second side, in the first direction DR1, of the display area DPA, e.g., on the lower side of the display area DPA. The first scan lines SL1 and the second scan lines SL2 may be connected to the scan line wire pads WPD_SC, and the data lines DTL may be connected to different data line wire pads WPD_DT. The initialization voltage lines VIL may be connected to initialization line wire pads WPD_Vint, the first voltage lines VL1 may be connected to first voltage line wire pads WPD_VL1, and the second voltage lines VL2 may be connected to second voltage line wire pads WPD_VL2. External devices may be mounted on the wire pads WPD. The external devices may be mounted on the wire pads WPD via anisotropic conductive films and/or ultrasonic bonding. The wire pads WPD are illustrated as being provided in the pad area PDA on the lower side of the display area DPA, but the present disclosure is not limited thereto. In some embodiments, some of the wire pads WPD may be provided on the upper side of the display area DPA and/or on the left and/or right side of the display area DPA.

A pixel PX or a subpixel SPXn (where n is an integer of 1 to 3) of the display device 10 includes a pixel driving circuit. The pixel driving circuit may include transistors and capacitors. The numbers of transistors and capacitors included in the pixel driving circuit may vary. For example, the pixel driving circuit may have a "3T1C" structure including three transistors and one capacitor. The pixel driving circuit will hereinafter be described as having the "3T1C" structure, but the present disclosure is not limited thereto. In some embodiments, various other suitable structures, such as a "2T1C", "7T1C", and/or "6T1C" structure, may also be applicable to the pixel driving circuit.

Figure 3:
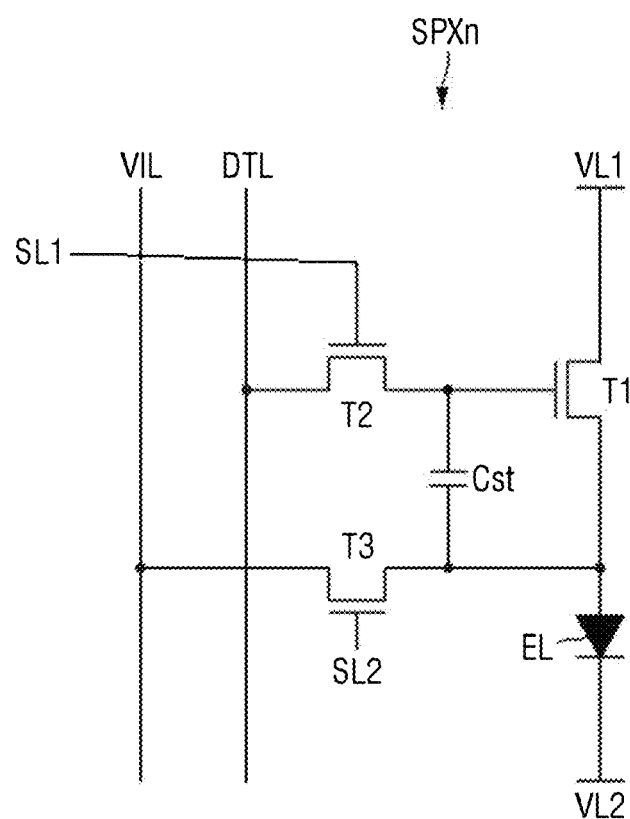
FIG. 3 is an equivalent circuit diagram of a subpixel of the display device of FIG. 1.

FIG. 3 is an equivalent circuit diagram of a subpixel of the display device of FIG. 1.

Referring to FIG. 3, a subpixel SPXn of the display device 10 includes a light-emitting diode (LED) "EL", three transistors, for example, first through third transistors T1 through T3, and one storage capacitor Cst.

The LED "EL" emits (e.g., is configured to emit) light in accordance with a current applied thereto via the first transistor T1. The LED "EL" includes a first electrode, a second electrode, and at least one light-emitting element provided between the first and second electrodes. The light-emitting element may emit light of a set or particular wavelength range in accordance with electric signals transmitted thereto from the first and second electrodes.

A first end of the LED "EL" may be connected (e.g., electrically coupled) to the source electrode of the first transistor T1, and a second end of the LED "EL" may be connected (e.g., electrically coupled) to a second voltage line VL2, to which a low-potential voltage (hereinafter, a second power supply voltage) is supplied. Here, the second power supply voltage is lower than a high-potential voltage (hereinafter, a first power supply voltage), which is supplied to a first voltage line VL1.

The first transistor T1 controls a current flowing from the first voltage line VL1, to which the first power supply voltage is supplied, to the LED "EL" in accordance with the difference in voltage between the gate electrode and the source electrode of the first transistor T1. For example, the first transistor T1 may be a transistor for driving the LED "EL". The gate electrode of the first transistor T1 may be connected to the source electrode of the second transistor T2, the source electrode of the first transistor T1 may be connected to the first electrode of the LED "EL", and the drain electrode of the first transistor T1 may be connected to the first voltage line VL1, to which the first power supply voltage is supplied.

The second transistor T2 is turned on by a scan signal from a first scan line SL1 to connect a data line DTL to the gate electrode of the first transistor T1. The gate electrode of the second transistor T2 may be connected to the first scan line SL1, the source electrode of the second transistor T2 may be connected to the gate electrode of the first transistor T1, and the drain electrode of the second transistor T2 may be connected to the data line DTL.

The third transistor T3 is turned on by a second scan signal from a second scan line SL2 to connect an initialization voltage line VIL to a first end of the LED "EL". The gate electrode of the third transistor T3 may be connected to the second scan line SL2, the drain electrode of the third transistor T3 may be connected to the initialization voltage line VIL, and the source electrode of the third transistor T3 may be connected to the first end of the LED "EL" or the source electrode of the first transistor T1.

The source electrodes and the drain electrodes of the first through third transistors T1 through T3 are not limited to the above descriptions. The first through third transistors T1 through T3 may be formed as thin-film transistors (TFTs). FIG. 3 illustrates that the first through third transistors T1 through T3 are formed as N-type metal-oxide semiconductor field-effect transistors (MOSFETs), but the present disclosure is not limited thereto. For example, in some embodiments, the first through third transistors T1 through T3 may all be formed as P-type MOSFETs. In some embodiments, some of the first through third transistors T1 through T3 may be formed as N-type MOSFETS, and other transistor(s) may be formed as P-type MOSFETs.

The storage capacitor Cst is formed between the gate electrode and the source electrode of the first transistor T1. The storage capacitor Cst stores a differential voltage corresponding to the difference in voltage between the gate electrode and the source electrode of the first transistor T1.

The structure of a pixel PX of the display device 10 will hereinafter be described in further detail.

Figure 4:
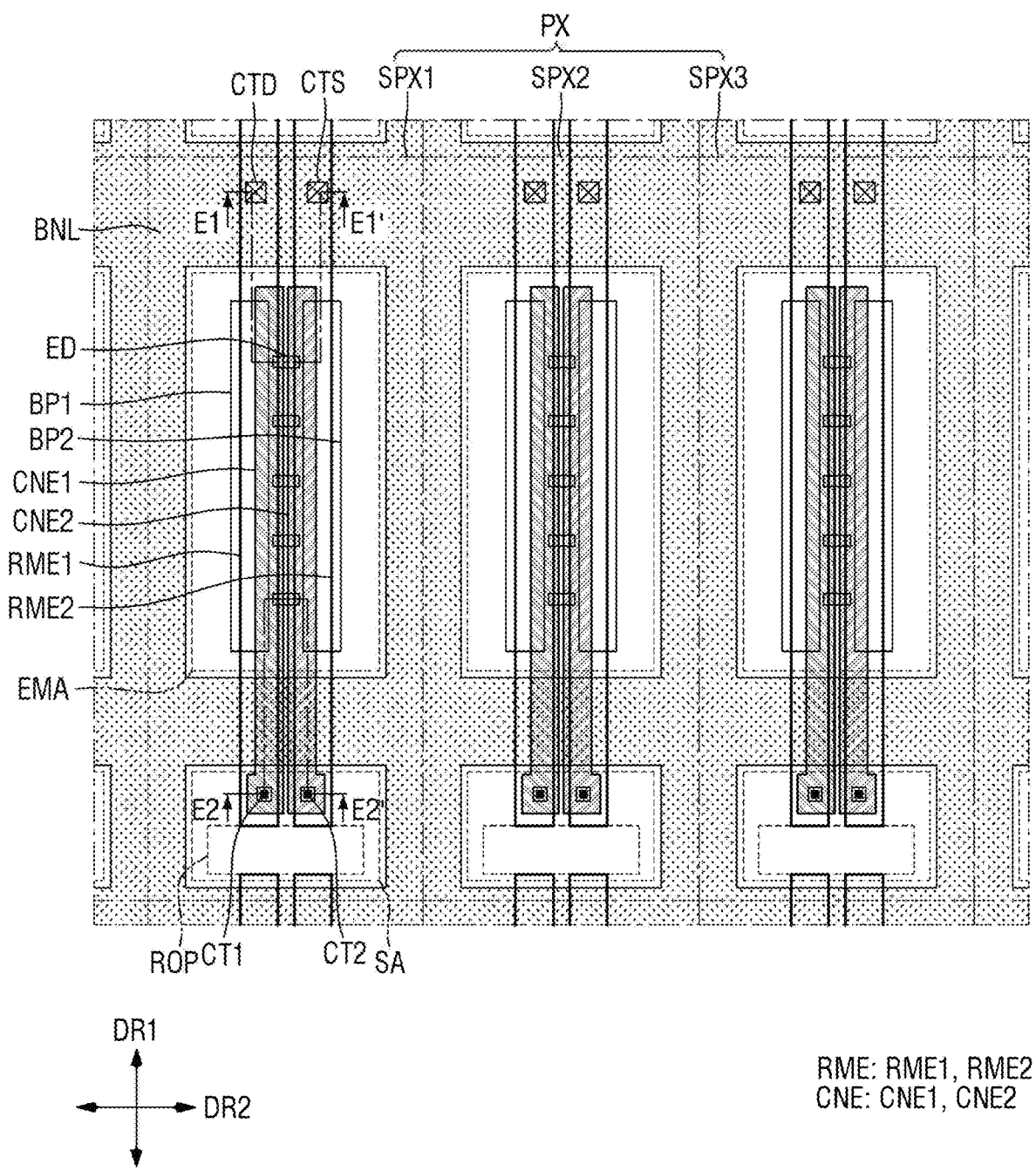
FIG. 4 is a plan view of a pixel of the display device of FIG. 1.

FIG. 4 is a plan view of a pixel of the display device of FIG. 1. FIG. 4 is a plan view illustrating the layout of electrodes RME, bank patterns (BP1 and BP2), a bank layer BNL, a plurality of light-emitting elements ED, and connecting electrodes CNE in a pixel PX of the display device 10.

Referring to FIG. 4, a pixel PX may include a plurality of subpixels SPXn. For example, the pixel PX may include first through third subpixels SPX1 through SPX3. The first subpixel SPX1 may emit first-color light, the second subpixel SPX2 may emit second-color light, and the third subpixel SPX3 may emit third-color light. For example, the first-color light, the second-color light, and the third-color light may be blue light, green light, and red light, respectively, but the present disclosure is not limited thereto. In some embodiments, the subpixels SPXn may all emit light of the same color. For example, the subpixels SPXn may all emit blue light. FIG. 4 illustrates that the pixel PX may include three subpixels SPXn, but the present disclosure is not limited thereto. In some embodiments, the pixel PX may include more than three subpixels SPXn.

Each of the subpixels SPXn may include an emission area EMA and a non-emission area. The emission area EMA may be an area that output light of a set or particular wavelength range due to the presence of light-emitting elements ED therein. The non-emission area may be an area that is not reached by light emitted by the light-emitting elements ED and does not output light due to the absence of light-emitting elements therein.

The emission area EMA may include a region where arrays of light-emitting elements ED are provided and a region around the array of light-emitting elements ED that outputs light emitted by the light-emitting elements ED. For example, the emission area EMA may also include a region that outputs light emitted by the light-emitting elements ED and then reflected and/or refracted by other members. A plurality of light-emitting elements ED may be provided in each of the subpixels SPXn to form an emission area EMA including a region where the light-emitting elements ED are provided and the surroundings of the region where the light-emitting elements ED are provided.

FIG. 4 illustrates that the emission areas EMA of the first through third subpixels SPX1 through SPX3 have the same size. In some embodiments, the emission areas EMA of the subpixels SPXn may have different sizes depending on the color and/or the wavelength of light emitted by light-emitting elements ED.

Each of the subpixels SPXn may further include a subarea SA, which is provided in the non-emission area of the corresponding subpixel SPXn. The subarea SA may be provided on the lower side of the emission area EMA. For example, in each of the subpixels SPXn, the emission area EMA and the subarea SA may be arranged one after another in the first direction DR1, and the subarea SA of each of the subpixels SPXn may be provided between two emission areas EMA of two adjacent subpixels SPXn that are spaced apart from each other in the first direction DR1. For example, a plurality of emission areas EMA and a plurality of subareas SA may be alternately arranged with each other in the first direction DR1, a plurality of emission areas EMA may be repeatedly arranged with each other in the second direction DR2, and a plurality of subareas SA may be repeatedly arranged with each other in the second direction DR2. However, the present disclosure is not limited to this example. For example, the emission areas EMA and the subareas SA of the subpixels SPXn may have a different layout from that illustrated in FIG. 4.

As no light-emitting elements ED are provided in the subarea SA of each of the subpixels SPXn, no light may be output from the subarea SA of each of the subpixels SPXn, but electrodes RME may be provided in part in the subarea SA of each of the subpixels SPXn. The electrodes RME of each of the subpixels SPXn may be separated from electrodes RME from another subpixel SPXn by a separation part ROP of the subarea SA of the corresponding subpixel SPXn.

Lines (and/or wires) and circuit elements of a circuit layer provided in the pixel PX to be connected to light-emitting elements ED may be connected to the first through third subpixels SPX1 through SPX3. However, the lines and the circuit elements may not be provided to correspond to the first through third subpixels SPX1 through SPX3, or to the emission areas EMA of the first through third subpixels SPX1 through SPX3, but may be provided regardless of the locations of the emission areas EMA of the first through third subpixels SPX1 through SPX3 in the pixel PX.

The bank layer BNL may be provided to surround the subpixels SPXn and the emission areas EMA and the subareas SA of the subpixels SPXn. The bank layer BNL may be provided not only along the boundaries between subpixels SPXn that are adjacent to one another in the first or second direction DR1 or DR2, but also along the boundaries between emission areas EMA, between subareas SA, and between the emission areas EMA and the subareas SA. The subpixels SPXn, the emission areas EMA, and the subareas SA of the display device 10 may be areas defined by the bank layer BNL. The distances between the subpixels SPXn, the emission areas EMA, and the subareas SA of the display device 10 may vary depending on the width of the bank layer BNL.

The bank layer BNL may include parts extending in the first direction DR1 and parts extending in the second direction DR2 and may be arranged in a lattice shape in a plan view, over the entire display area DPA. The bank layer BNL may be provided along the boundaries of each of the subpixels SPXn to separate the subpixels SPXn from one another. The bank layer BNL may be provided to surround and separate the emission areas EMA and the subareas SA of the subpixels SPXn.

Figure 5:
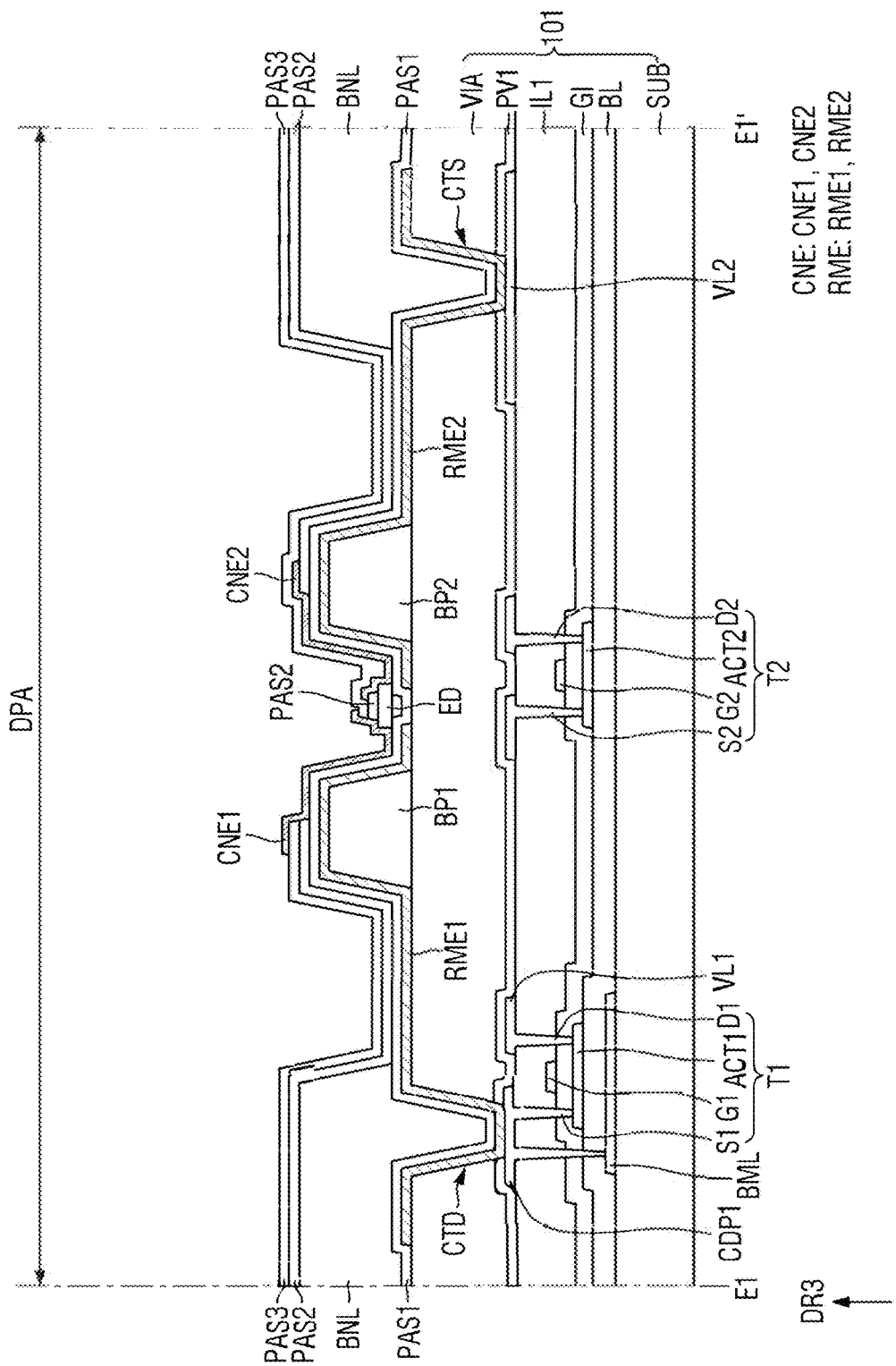
FIG. 5 is a cross-sectional view taken along line E1-E1' of FIG. 4.
Figure 6:
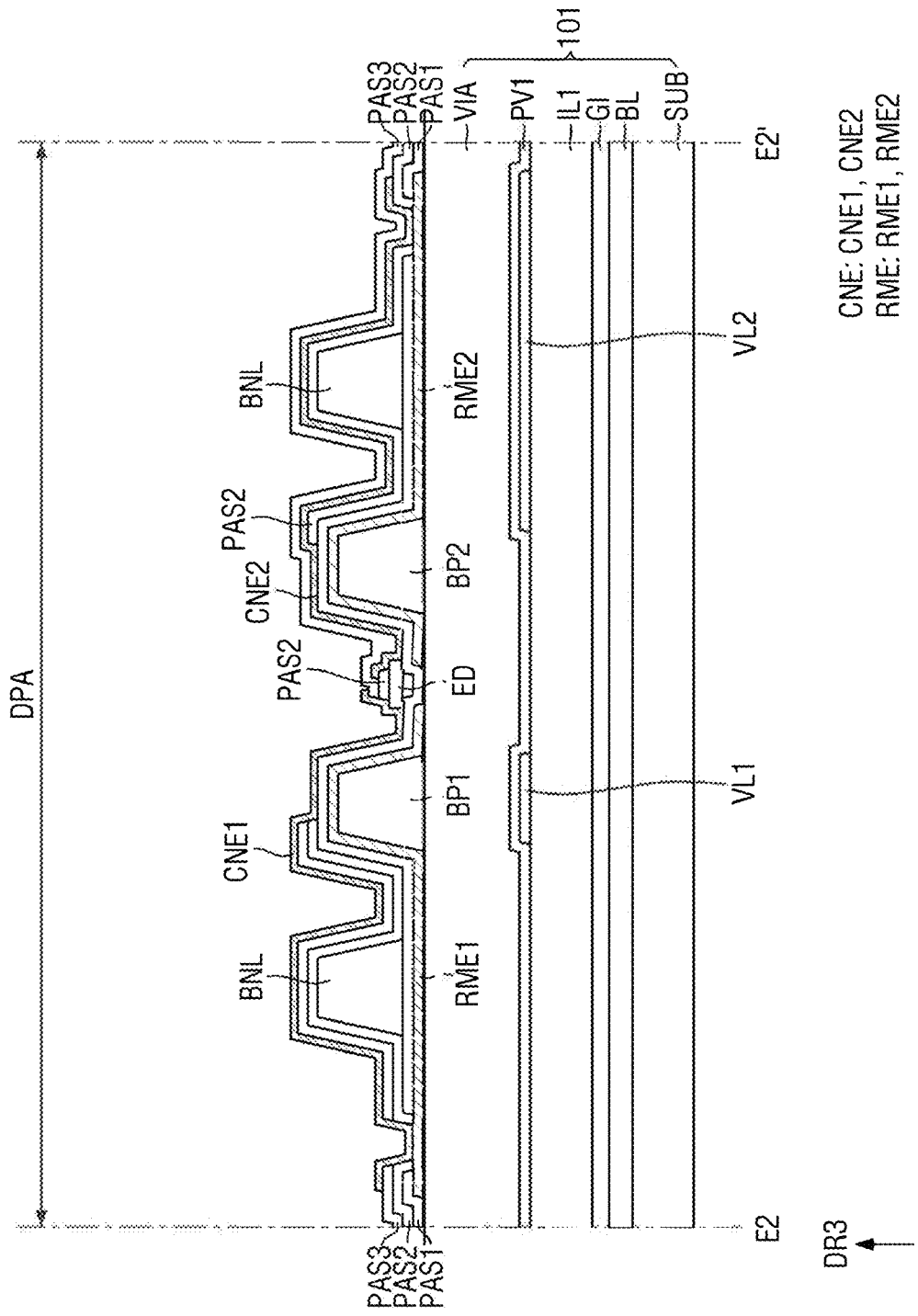
FIG. 6 is a cross-sectional view taken along line E2-E2' of FIG. 4.

FIG. 5 is a cross-sectional view taken along line E1-E1' of FIG. 4. FIG. 6 is a cross-sectional view taken along line E2-E2' of FIG. 4. FIG. 5 illustrates a cross-sectional view taken across both end portions of a light-emitting element ED and first and second electrode contact holes CTD and CTS in the first subpixel SPX1 of FIG. 4, and FIG. 6 illustrates a cross-sectional view taken across both end portions of a light-emitting element ED and first and second contacts CT1 and CT2 of the first subpixel SPX1 of FIG. 4.

Referring to FIGS. 5 and 6 and further to FIG. 4, the display device 10 may include a first substrate SUB and a wiring substrate 101, which is provided on the first substrate SUB and includes a semiconductor layer, a plurality of conductive layers, and a plurality of insulating layers. The display device 10 may include, for example, in the first subpixel SPX1, electrodes RME, light-emitting elements ED, and connecting electrodes CNE, which are provided on the wiring substrate 101. The semiconductor layer, the conductive layers, and the insulating layers of the wiring substrate 101 may form a circuit layer of the display device 10.

The first substrate SUB may be an insulating substrate. The first substrate SUB may be formed of an insulating material such as glass, quartz, and/or a polymer resin. The first substrate SUB may be a rigid substrate or may be a flexible substrate that is bendable, foldable, and/or rollable. The first substrate SUB may include a display area DPA and a non-display area NDA, which surrounds the display area DPA, and the display area DPA may include an emission area EMA and a subarea SA, which is a portion of a non-emission area.

A first conductive layer may be provided on the first substrate SUB. The first conductive layer includes a lower metal layer BML, and the lower metal layer BML is provided to overlap with a first active layer ACT1 of a first transistor T1. The lower metal layer BML may prevent or reduce light from being incident upon the first active layer ACT1 of the first transistor T1 and/or may be electrically connected to the first active layer ACT1 to stabilize the electrical characteristics of the first transistor T1. In some embodiments, the lower metal layer BML may not be provided.

A buffer layer BL may be provided on the lower metal layer BML and the first substrate SUB. The buffer layer BL may be formed on the first substrate SUB to protect the transistors of the first subpixel SPX1 from moisture that may penetrate through the first substrate SUB, which is vulnerable to moisture, and may perform a surface planarization function.

The semiconductor layer is provided on the buffer layer BL. The semiconductor layer may include the first active layer ACT1 of the first transistor T1 and a second active layer ACT2 of a second transistor T2. The first and second active layers ACT1 and ACT2 may be provided to partially overlap with first and second gate electrodes G1 and G2, respectively, of a second conductive layer that will be described in more detail herein below.

The semiconductor layer may include polycrystalline silicon, monocrystalline silicon, and/or an oxide semiconductor. In some embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

In some embodiments, the first subpixel SPX1 may include only one transistor, for example, the first transistor T1, but the present disclosure is not limited thereto. In one or more other embodiments, the first subpixel SPX1 may include more than one transistor.

The first gate insulating layer GI is provided on the semiconductor layer and the buffer layer BL, in the display area DPA. The first gate insulating layer GI may not be provided in the pad area PDA. The first gate insulating layer GI may function as a gate insulating layer for first and second transistors T1 and T2 of the second conductive layer. The first gate insulating layer GI is illustrated as being provided on the entire surface of the buffer layer BL, but the present disclosure is not limited thereto. In some embodiments, the first gate insulating layer GI may be patterned together with first and second gate electrodes G1 and G2 of the second conductive layer that will be described in more detail herein below, and may thus be placed in part between the second conductive layer and the first and second active layers ACT1 and ACT2 of the semiconductor layer.

The second conductive layer is provided on the first gate insulating layer GI. The second conductive layer may include the first and second gate electrodes G1 and G2 of the first and second transistors T1 and T2. The first gate electrode G1 may overlap with the channel region of the first active layer ACT1 in a thickness direction, i.e., in the third direction DR3, and the second gate electrode G2 may overlap with the channel region of the second active layer ACT2 in the thickness direction, i.e., in the third direction DR3. In one or more embodiments, the second conductive layer may further include a first electrode of a storage capacitor.

The first interlayer insulating layer IL1 is provided on the second conductive layer. The first interlayer insulating layer IL1 may function as an insulating film between the second conductive layer and layers provided on the second conductive layer and may protect the second conductive layer.

A third conductive layer is provided on the first interlayer insulating layer IL1. The third conductive layer may include the first and second voltage lines VL1 and VL2, the first conductive pattern CDP1, first and second source electrodes S1 and S2 of the first and second transistors T1 and T2 and first and second drain electrodes D1 and D2 of the first and second transistors T1 and T2, which are all provided in the display area DPA. In one or more embodiments, the third conductive layer may further include a second electrode of the storage capacitor.

A high-potential voltage (or a first power supply voltage) to be delivered to a first electrode RME1 may be applied to the first voltage line VL1, and a low-potential voltage (or a second power supply voltage) to be delivered to a second electrode RME2 may be applied to the second voltage line VL2. Portion of the first voltage line VL1 may be in contact with the first active layer ACT1 of the first transistor T1 through a contact hole that penetrates the first interlayer insulating layer IL1 and the first gate insulating layer GI. The first voltage line VL1 may function as a first drain electrode D1 of the first transistor T1. The second voltage line VL2 may be directly connected to the second electrode RME2.

The first conductive pattern CDP1 may be in contact with the active layer ACT1 of the first transistor T1 through a contact hole that penetrates the first interlayer insulating layer IL1 and the first gate insulating layer GI. Also, the first conductive pattern CDP1 may be in contact with the lower metal layer BML through another contact hole. The first conductive pattern CDP1 may function as a first source electrode S1 of the first transistor T1. The first conductive pattern CDP1 may be connected to the first electrode RME1 or a first connecting electrode CNE1 that will be described in more detail herein below. The first transistor T1 may transmit the first power supply voltage from the first voltage line VL1 to the first electrode RME1 or the first connecting electrode CNE1.

The second source electrode and the second drain electrode D2 may be in contact with the second active layer ACT2 of the second transistor T2 through contact holes penetrating the first interlayer insulating layer IL1 and the first gate insulating layer GI. The second transistor T2 may be one of the switching transistors described above with reference to FIG. 3. The second transistor T2 may transmit a signal applied from the data line DTL of FIG. 3 to the first transistor T1, or may transmit a signal applied from the initialization voltage line VIL of FIG. 3 to the second electrode of the storage capacitor.

The first passivation layer PV1 is provided on the third conductive layer. The first passivation layer PV1 may function as an insulating film between the third conductive layer and other layers and protect the third conductive layer.

Each of the buffer layer BL, the first gate insulating layer GI, the first interlayer insulating layer IL1, and the first passivation layer PV1 may include (e.g., may consist of) a plurality of inorganic layers that are alternately stacked. For example, each of the buffer layer BL, the first gate insulating layer GI, the first interlayer insulating layer IL1, and the first passivation layer PV1 may be formed as a double- or multilayer in which inorganic layers of at least one of silicon oxide ($SiO_x$), silicon nitride ($SiN_x$), or silicon oxynitride ($SiO_xN_y$) are alternately stacked, but the present disclosure is not limited thereto. In another example, each of the buffer layer BL, the first gate insulating layer GI, the first interlayer insulating layer IL1, and the first passivation layer PV1 may be formed as a single inorganic layer including silicon oxide ($SiO_x$), silicon nitride ($SiN_x$), and/or silicon oxynitride ($SiO_xN_y$). In some embodiments, the first interlayer insulating layer IL1 may be formed of an organic insulating material such as polyimide (PI).

A via layer VIA is provided on the third conductive layer, in the display area DPA. The via layer VIA may include an organic insulating material such as, for example, PI, and may perform a surface planarization function by compensating for any height differences generated by the underlying conductive layers. In some embodiments, the via layer VIA may not be provided.

The display device 10 may include, as a display element layer on the via layer VIA of the wiring substrate 101, the bank patterns (BP1 and BP2), the electrodes RME, the bank layer BNL, the light-emitting elements ED, and the connecting electrodes CNE. The display device 10 may include first through third insulating layers PAS1 through PAS3, which are provided on the wiring substrate 101.

The bank patterns (BP1 and BP2) may be provided in the emission area EMA of the first subpixel SPX1. The bank patterns (BP1 and BP2) may have a set or predetermined width in the second direction DR2 and may extend in the first direction DR1.

For example, the bank patterns (BP1 and BP2) may include first and second bank patterns BP1 and BP2, which are provided in the emission area EMA of the first subpixel SPX1 to be spaced apart from one another in the second direction DR2. The first bank pattern BP1 may be provided on a first side, in the second direction DR2, of the center of the emission area EMA, for example, on the left side of the emission area EMA, and the second bank pattern BP2 may be provided on a second side, in the second direction DR2, of the center of the emission area EMA, for example, on the right side of the emission area EMA. The first and second bank patterns BP1 and BP2 may be arranged one after another in the second direction DR2 and may be provided as islands in the display area DPA. The light-emitting elements ED may be provided between the first and second bank patterns BP1 and BP2.

The lengths, in the first direction DR1, of the first and second bank patterns BP1 and BP2 may be the same and may be less than the length, in the first direction DR1, of the emission area EMA, surrounded by the bank layer BNL. The first and second bank patterns BP1 and BP2 may be spaced apart from portions of the bank layer BNL that extend in the second direction DR2, but the present disclosure is not limited thereto. The bank patterns (BP1 and BP2) may be integrally formed with the bank layer BNL or may partially overlap with the portions of the bank layer BNL that extend in the second direction DR2, in which case, the length, in the first direction DR1, of the bank patterns (BP1 and BP2) may be the same as, or greater than the length, in the first direction DR1, of the emission area EMA, surrounded by the bank layer BNL.

The first and second bank patterns BP1 and BP2 may have the same width in the second direction DR2, but the present disclosure is not limited thereto. In some embodiments, the first and second bank patterns BP1 and BP2 may have different widths in the second direction DR2. For example, one of the first and second bank patterns BP1 and BP2 may have a larger width than the other bank pattern and may be provided across more than one subpixel SPXn adjacent to one another in the second direction DR2. In this example, whichever of the first and second bank patterns BP1 and BP2 is wider than the other bank pattern may overlap with portion of the bank layer BNL that extends in the first direction DR1, in the thickness direction. The first subpixel SPX1 is illustrated as having two bank patterns having the same width, but the present disclosure is not limited thereto. The number and the shape of bank patterns provided in the first subpixel SPX1 may suitably vary depending on the number and the layout of electrodes RME provided in the first subpixel SPX1.

The bank patterns (BP1 and BP2) may be provided on the via layer VIA. For example, the bank patterns (BP1 and BP2) may be provided directly on the via layer VIA and may protrude at least in part (e.g., partially) from the top surface of the via layer VIA. Each of protruding portions of the bank patterns (BP1 and BP2) may have inclined sides and/or curved sides, and light emitted from the light-emitting elements ED may be reflected by the electrodes RME arranged on the bank patterns (BP1 and BP2) to be emitted in an upward direction from the via layer VIA. In some embodiments, the bank patterns (BP1 and BP2) may have a curved shape, for example, a semicircular or semielliptical shape, in a cross-sectional view. The bank patterns (BP1 and BP2) may include an inorganic insulating material such as PI, but the present disclosure is not limited thereto.

The electrodes RME may extend in one direction to be provided in the first subpixel SPX1. The electrodes RME may extend in the first direction DR1 to be provided in the emission area EMA and the subarea SA of the first subpixel SPX1 and may be spaced apart from one another in the second direction DR2. The electrodes RME may be electrically connected to the light-emitting elements ED that will be described in more detail herein below, but the present disclosure is not limited thereto. In some embodiments, the electrodes RME may not be electrically connected to the light-emitting elements ED.

The display device 10 may include, in the first subpixel SPX1, first and second electrodes RME1 and RME2. The first electrode RME1 may be provided on the left side of the center of the emission area EMA, and the second electrode RME2 may be spaced apart from the first electrode RME1 in the second direction DR2 and may be provided on the right side of the center of the emission area EMA. The first electrode RME1 may be provided on the first bank pattern BP1, and the second electrode RME2 may be provided on the second bank pattern BP2. The first and second electrodes RME1 and RME2 may be provided in part on the outside of the emission area EA and in the subarea SA, beyond the bank layer BNL. First electrodes RME1 and second electrodes RME2 from two different subpixels SPXn (e.g., adjacent to each other in the first direction DR1) may be spaced apart from each other, respectively, by a separation part ROP of a subarea SA of one of the two different subpixels SPXn.

FIGS. 4 through 6 illustrate that two electrodes RME are provided in the first subpixel SPX1 to extend in the first direction DR1, but the present disclosure is not limited thereto. In some embodiments, the electrodes RME may be bent in part and may have different widths from one location to another location.

The electrodes RME may be provided at least on inclined sides of the bank patterns (BP1 and BP2). The distance, in the second direction DR2, between the electrodes RME may be less than the distance, in the second direction DR2, between the bank patterns (BP1 and BP2). The first and second electrodes RME1 and RME2 may be provided, at least in part, directly on the via layer VIA to be placed on the same plane.

The light-emitting elements ED, which are provided between the bank patterns (BP1 and BP2), emit light through both end portions thereof, and the emitted light may travel toward the electrodes RME on the bank patterns (BP1 and BP2). Portions of the electrodes RME that are provided on the bank patterns (BP1 and BP2) may have a structure capable of reflecting light emitted from the light-emitting elements ED. The first and second electrodes RME1 and RME2 may be provided to cover at least sides of the bank patterns (BP1 and BP2) to reflect light emitted from the light-emitting elements ED.

The electrodes RME may be in direct contact with the third conductive layer through the first and second electrode contact holes CTD and CTS in an area where the electrodes RME overlap with the bank layer BNL, between the emission area EMA and the subarea SA. The first electrode contact hole CTD may be formed in a region where the bank layer BNL and the first electrode RME1 overlap with each other, and the second electrode contact hole CTS may be formed in a region where the bank layer BNL and the second electrode RME2 overlap with each other. The first electrode RME1 may be in contact with the first conductive pattern CDP1 through the first electrode contact hole CTD, which penetrates the via layer VIA and the first passivation layer PV1. The second electrode RME2 may be in contact with the second voltage line VL2 through the second electrode contact hole CTS, which penetrates the via layer VIA and the first passivation layer PV1. The first electrode RME1 may be electrically connected to the first transistor T1 through the first conductive pattern CDP1 and may thus receive the first power supply voltage, and the second electrode RME2 may be electrically connected to the second voltage line VL2 and may thus receive the second power supply voltage. However, the present disclosure is not limited to this. In some embodiments, the electrodes RME may not be electrically connected to the first and second voltage lines VL1 and VL2 of the third conductive layer and may be directly connected to the third conductive layer.

The electrodes RME may include a conductive material with high reflectance. For example, the electrodes RME may include a metal such as silver (Ag), copper (Cu), and/or aluminum (Al); an alloy including Al, nickel (Ni), and/or lanthanum (La); and/or a stack of a layer of such alloy and a layer of a metal such as titanium (Ti), molybdenum (Mo), and/or niobium (Nb). In some embodiments, the electrodes RME may be formed as double- or multilayers in which at least one layer of an alloy containing Al and at least one layer of a metal such as Ti, Mo, and/or Nb are stacked.

However, the present disclosure is not limited to this. In some embodiments, the electrodes RME may further include a transparent conductive material. For example, the electrodes RME may include a material such as ITO, IZO, and/or IZTO. In some embodiments, the electrodes RME may have a structure in which at least one layer of a transparent conductive material and at least one layer of a metal with high reflectance are stacked, or may be formed as single-layer films including the transparent conductive material and the metal with high reflectance. For example, the electrodes RME may have a stack structure such as ITO/Ag/ITO/, ITO/Ag/IZO, or ITO/Ag/IZTO/IZO. The electrodes RME may be electrically connected to the light-emitting elements ED and may reflect light some of light, emitted from the light-emitting elements ED, in an upward direction from the first substrate SUB.

The first insulating layer PAS1 may be provided in the entire display area DPA, on the via layer VIA and the electrodes RME. The first insulating layer PAS1 may protect the electrodes RME and may insulate the electrodes RME from each other. For example, as the first insulating layer PAS1 is provided to cover the electrodes RME, before the formation of the bank layer BNL, the first insulating layer PAS1 can prevent or reduce damage to the electrodes RME during the formation of the bank layer BNL. Also, the first insulating layer PAS1 can prevent or reduce direct contact of the light-emitting elements ED with, and damaged by, other members.

The first insulating layer PAS1 may be formed to be recessed in part between the electrodes RME, which are spaced apart from each other in the second direction DR2. The light-emitting elements ED may be provided on the top surface of a recessed portion of the first insulating layer PAS1, and space may be formed between the light-emitting elements ED and the first insulating layer PAS1.

The bank layer BNL may be provided on the first insulating layer PAS1. The bank layer BNL may include parts extending in the first direction DR1 and parts extending in the second direction DR2 and may surround the first subpixel SPX1. The bank layer BNL may be provided along the boundaries of the display area DPA to separate the display area DPA and the non-display area NDA. The bank layer BNL may be provided in the entire display area DPA to form a lattice shape, and portions of the display area DPA that are opened by the bank layer BNL may include the emission area EMA and the subarea SA.

The bank layer BNL, like the bank patterns (BP1 and BP2), may have a set or predetermined height. In some embodiments, the height of the bank layer BNL may be greater than the height of the bank patterns (BP1 and BP2), and the thickness of the bank layer BNL may be the same as, or greater than, the thickness of the bank patterns (BP1 and BP2). The bank layer BNL may prevent or reduce the spilling of ink into neighboring subpixels SPXn in an inkjet printing process as performed during the fabrication of the display device 10. The bank layer BNL, like the bank patterns (BP1 and BP2), may include an organic insulating material such as PI.

The light-emitting elements ED may be provided in the emission area EMA of the first subpixel SPX1. The light-emitting elements ED may be provided between the bank patterns (BP1 and BP2) and may be spaced apart from one another in the first direction DR1. The light-emitting elements ED may extend in one direction, and both end portions of each of the light-emitting elements ED may be on different electrodes RME. The length of the light-emitting elements ED may be greater than the distance, in the second direction DR2, of (e.g., between) the electrodes RME. The light-emitting elements ED may be arranged in a direction perpendicular (or substantially perpendicular) to the direction in which the electrodes RME extend, e.g., in a direction perpendicular (or substantially perpendicular) to the first direction DR1, but the present disclosure is not limited thereto. The direction in which the light-emitting elements SED extend may be the second direction DR2 or a direction inclined from the second direction DR2.

The light-emitting elements ED may be provided on the first insulating layer PAS1. The light-emitting elements ED may extend in one direction, and the direction in which the light-emitting elements ED extend may be parallel (or substantially parallel) to the top surface of the first substrate SUB. As will be described in more detail herein below, each of the light-emitting elements ED may include multiple semiconductor layers that are arranged in the direction in which the light-emitting elements ED extend, and the multiple semiconductor layers may be sequentially arranged in a direction parallel (or substantially parallel) to the top surface of the first substrate SUB. However, the present disclosure is not limited to this. In some embodiments, the multiple semiconductor layers may be arranged in a direction perpendicular (or substantially perpendicular) to the first substrate SUB.

The light-emitting elements ED of one subpixel SPXn may emit light of a different wavelength range from the light-emitting elements ED of another subpixel SPXn, depending on the materials of the semiconductor layers of each of the light-emitting elements ED of each subpixel SPXn, but the present disclosure is not limited thereto. In some embodiments, the semiconductor layers of each of the light-emitting elements ED of one subpixel SPXn may include the same materials as the semiconductor layers of each of the light-emitting elements ED of another subpixel SPXn, so that the light-emitting elements ED of one subpixel SPXn may emit light of the same color as the light-emitting elements ED of another subpixel SPXn.

The light-emitting elements ED may be in contact with the connecting electrodes CNE to be electrically connected to the electrodes RME and the conductive layers below the via layer VIA, and may emit light of a set or particular wavelength range in response to electrical signals being applied thereto.

The second insulating layer PAS2 may be provided on the light-emitting elements ED, the first insulating layer PAS1, and the bank layer BNL. The second insulating layer PAS2 may include pattern parts, which extend in the first direction DR1 between the bank patterns (BP1 and BP2) and are provided on the light-emitting elements ED. The pattern parts may be provided to surround the outer surfaces of each of the light-emitting elements ED, but not to cover both sides or both end portions of each of the light-emitting elements ED. The pattern parts may form linear and/or island patterns in the first subpixel SPX1 in a plan view. The pattern portions of the second insulating layer PAS2 may protect the light-emitting elements ED and may fix (e.g., affix) the light-emitting elements ED during the fabrication of the display device 10. The second insulating layer PAS2 may be provided to fill the space between the first insulating layer PAS1 and the light-emitting elements ED. Portions of the second insulating layer PAS2 may be provided on the bank layer BNL and in the subarea SA.

The connecting electrodes CNE may be provided on the electrodes RME and the bank patterns (BP1 and BP2). The connecting electrodes CNE may extend in one direction and may be spaced apart from each other. The connecting electrodes CNE may be in contact with the light-emitting elements ED and may be electrically connected to the third conductive layer.

The connecting electrodes CNE may include first and second connecting electrodes CNE1 and CNE2, which are provided in the first subpixel SPX1. The first connecting electrode CNE1 may extend in the first direction DR1 and may be provided on the first electrode RME1 and/or the first bank pattern BP1. The first connecting electrode CNE1 may partially overlap with the first electrode RME1 and may be provided not only in the emission area EMA, but also in the subarea SA, beyond the bank layer BNL. The second connecting electrode CNE2 may extend in the first direction DR1 and may be provided on the second electrode RME2 and/or the second bank pattern BP2. The second connecting electrode CNE2 may partially overlap with the second electrode RME2 and may be provided not only in the emission area EMA, but also in the subarea SA, beyond the bank layer BNL. The first and second connecting electrodes CNE1 and CNE2 may be in contact with the light-emitting elements ED and may be electrically connected to the electrodes RME and/or the underlying conductive layers.

For example, the first and second connecting electrodes CNE1 and CNE2 may be provided on side surfaces of the second insulating layer PAS2 and may be in contact with the light-emitting elements ED. The first connecting electrode CNE1 may partially overlap with the first electrode RME1 and may be in contact with first end portions of the light-emitting elements ED. The second connecting electrode CNE2 may partially overlap with the second electrode RME2 and may be in contact with second end portions of the light-emitting elements ED. The connecting electrodes CNE may be provided not only in the emission area EMA, but also in the subarea SA beyond the emission area EMA. The connecting electrodes CNE may be in contact with the light-emitting elements ED, in the emission area EMA, and may be electrically connected to the third conductive layer, in the subarea SA.

The connecting electrodes CNE may be in contact with the electrodes RME through the first and second contacts CT1 and CT2, which are provided in the subarea SA. The first connecting electrode CNE1 may be in contact with the first electrode RME1 through the first contact CT1, which penetrates the first through third insulating layers PAS1 through PAS3, in the subarea SA. The second connecting electrode CNE2 may be in contact with the second electrode RME2 through the second contact CT2, which penetrates the first and second insulating layers PAS1 and PAS2, in the subarea SA. The connecting electrodes CNE may be electrically connected to the third conductive layer through the electrodes RME. The first connecting electrode CNE1 may be electrically connected to the first transistor T1 to receive the first power supply voltage, and the second connecting electrode CNE2 may be electrically connected to the second voltage line VL2 to receive the second power supply voltage. The connecting electrodes CNE may be in contact with the light-emitting elements ED, in the emission area EMA, to transmit power supply voltages to the light-emitting elements ED.

However, the present disclosure is not limited to this. In some embodiments, the connecting electrodes CNE may be in direct contact with the third conductive layer or may be electrically connected to the third conductive layer not through the electrodes RME, but through other patterns (or elements).

The connecting electrodes CNE may include a conductive material. For example, the connecting electrodes CNE may include ITO, IZO, IZTO, and/or Al. For example, the connecting electrodes CNE may include a transparent conductive material so that light emitted by the light-emitting elements ED may be output through the connecting electrodes CNE.

The third insulating layer PAS3 is provided on the second connecting electrode CNE2 and the second insulating layer PAS2. The third insulating layer PAS3 may be provided on the entire surface of the second insulating layer PAS2 to cover the second connecting electrode CNE2, and the first connecting electrode CNE1 may be provided on the third insulating layer PAS3. The third insulating layer PAS3 may be provided on the entire surface of the via layer VIA except for an area where the first connecting electrode CNE1 is provided. The third insulating layer PAS3 may insulate the first and second connecting electrodes CNE1 and CNE2 from each other so that the first and second connecting electrodes CNE1 and CNE2 may not be in direct contact with each other.

In one or more embodiments, another insulating layer may be further provided on the third insulating layer PAS3 and the first connecting electrode CNE1. The insulating layer may protect the members provided on the first substrate SUB from an external environment.

The first through third insulating layers PAS1 through PAS3 may include an inorganic insulating material and/or an organic insulating material. For example, the first through third insulating layers PAS1 through PAS3 may all include an inorganic insulating material. In another example, the first and third insulating layers PAS1 and PAS3 may include an inorganic insulating material, and the second insulating layer PAS2 may include an organic insulating material. At least one of the first through third insulating layers PAS1 through PAS3 may have a structure in which multiple insulating layers are alternately or repeatedly stacked. The first through third insulating layers PAS1 through PAS3 may include one of silicon oxide ($SiO_x$), silicon nitride ($SiN_x$), or silicon oxynitride ($SiO_xN_y$). The first through third insulating layers PAS1 through PAS3 may include the same material, some of the first through third insulating layers PAS1 through PAS3 may include the same material, or the first through third insulating layers PAS1 through PAS3 may include different materials.

Figure 7:
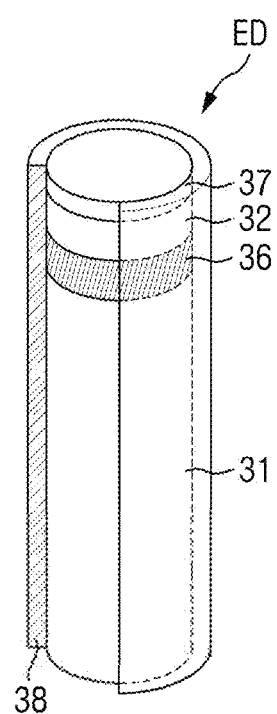
FIG. 7 is a perspective view of a light-emitting element according to one or more embodiments of the present disclosure.

FIG. 7 is a perspective view of a light-emitting element according to one or more embodiments of the present disclosure.

Referring to FIG. 7, a light-emitting element ED may be an LED. For example, the light-emitting element ED may be an ILED having a size of several nanometers or micrometers and formed of an inorganic material. If an electric field is formed in a set or particular direction between two opposite electrodes, the light-emitting element ED may be aligned between the two electrodes where polarities are formed.

The light-emitting element ED may have a shape that extends in one direction. The light-emitting element ED may have the shape of a cylinder, a rod, a wire, and/or a tube, but the shape of the light-emitting element ED is not particularly limited. In some embodiments, the light-emitting element ED may have the shape of a polygonal column such as a regular cube, a rectangular parallelepiped, and/or a hexagonal column, or may have a shape that extends in one direction but with a partially inclined outer surface.

The light-emitting element ED may include semiconductor layers doped with a dopant of an arbitrary (e.g., selected) conductivity type (e.g., a p type or an n type). The semiconductor layers may receive electric signals from an external power source to emit light of a set or particular wavelength range. The light-emitting element ED may include a first semiconductor layer 31, a second semiconductor layer 32, a light-emitting layer 36, an electrode layer 37, and an insulating film 38.

The first semiconductor layer 31 may include an n-type semiconductor. The first semiconductor layer 31 may include a semiconductor material, for example, $Al_xGa_yIn_{1-x-y}N$ (where $0 \leq x \leq 1$, $0 \leq y \leq 1$, and $0 \leq x+y \leq 1$). For example, the first semiconductor layer 31 may include at least one of AlGaInN, GaN, AlGaN, InGaN, AlN, or InN that are doped with an n-type dopant. The n-type dopant may be Si, Ge, Se, and/or Sn.

The second semiconductor layer 32 may be provided on the first semiconductor layer 31 with the light-emitting layer 36 interposed therebetween. The second semiconductor layer 32 may include a p-type semiconductor. The second semiconductor layer 32 may include a semiconductor material, for example, $Al_xGa_yIn_{1-x-y}N$ (where $0 \leq x \leq 1$, $0 \leq y \leq 1$, and $0 \leq x+y \leq 1$). For example, the second semiconductor layer 32 may include at least one of AlGaInN, GaN, AlGaN, InGaN, AlN, or InN that are doped with a p-type dopant. The p-type dopant may be Mg, Zn, Ca, and/or Ba.

FIG. 7 illustrates that the first and second semiconductor layers 31 and 32 are formed as single layers, but the present disclosure is not limited thereto. In some embodiments, each of the first and second semiconductor layers 31 and 32 may include more than one layer such as, for example, a clad layer and/or a tensile strain barrier reducing (TSBR) layer, depending on the material of the light-emitting layer 36. For example, the light-emitting element ED may further include a semiconductor layer between the first semiconductor layer 31 and the light-emitting layer 36, or a semiconductor layer between the second semiconductor layer 32 and the light-emitting layer 36. The semiconductor layer between the first semiconductor layer 31 and the light-emitting layer 36 may include at least one of AlGaInN, GaN, AlGaN, InGaN, AlN, or InN that are doped with an n-type dopant, and the semiconductor layer between the second semiconductor layer 32 and the light-emitting layer 36 may include at least one of AlGaInN, GaN, AlGaN, InGaN, AlN, or InN that are doped with a p-type dopant.

The light-emitting layer 36 may be provided between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electric signals applied thereto via the first and second semiconductor layers 31 and 32. The light-emitting layer 36 may include a material such as AlGaN, AlGaInN, and/or InGaN. In one or more embodiments, in a case where the light-emitting layer 36 has a multi-quantum well structure in which multiple quantum layers and multiple well layers are alternately stacked, the quantum layers may include a material such as AlGaN and/or AlGaInN, and the well layers may include a material such as GaN, InGaN, and/or AlInN.

The light-emitting layer 36 may have a structure in which a semiconductor material having a large band gap energy and a semiconductor material having a small band gap energy are alternately stacked, or may include group-III and/or group-V semiconductor materials depending on the wavelength of light to be emitted. The type (or kind) of light emitted by the light-emitting layer 36 is not particularly limited. The light-emitting layer 36 may emit light of a red or green wavelength range as necessary (or desired), instead of blue light.

The electrode layer 37 may be an ohmic connecting electrode, but the present disclosure is not limited thereto. In some embodiments, the electrode layer 37 may be a Schottky connecting electrode. The light-emitting element ED may include at least one electrode layer 37. The light-emitting element ED may include more than one electrode layer 37, but the present disclosure is not limited thereto. In some embodiments, the electrode layer 37 may not be provided.

The electrode layer 37 may reduce the resistance between the light-emitting element ED and electrodes RME (or connecting electrodes CNE) when the light-emitting element ED is electrically connected to the electrodes RME (or the connecting electrodes CNE). The electrode layer 37 may include a conductive metal. For example, the electrode layer 37 may include at least one of Al, Ti, In, Au, Ag, ITO, IZO, or IZTO.

The insulating film 38 may be provided to surround the first and second semiconductor layers 31 and 32 and the electrode layer 37. For example, the insulating film 38 may be provided to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$). The insulating film 38 is illustrated as being a single-layer film, but the present disclosure is not limited thereto. In some embodiments, the insulating film 38 may be formed as a multilayer film in which multiple layers are stacked.

The insulating film 38 may protect the first and second semiconductor layers 31 and 32 and the electrode layer 37. The insulating film 38 can prevent or reduce the risk of a short circuit that may occur in the light-emitting element ED in the event the light-emitting element ED is in direct contact with electrodes to which electric signals are applied. Also, the insulating film 38 can prevent or reduce the degradation of the emission efficiency of the light-emitting element ED.

The outer surface of the insulating film 38 may be subjected to surface treatment. The light-emitting element ED may be sprayed on electrodes while being dispersed in a set or predetermined ink. Here, the surface of the insulating film 38 may be hydrophobically or hydrophilically treated to keep the light-emitting element ED dispersed in ink without agglomerating with other neighboring light-emitting elements ED.

Figure 8:
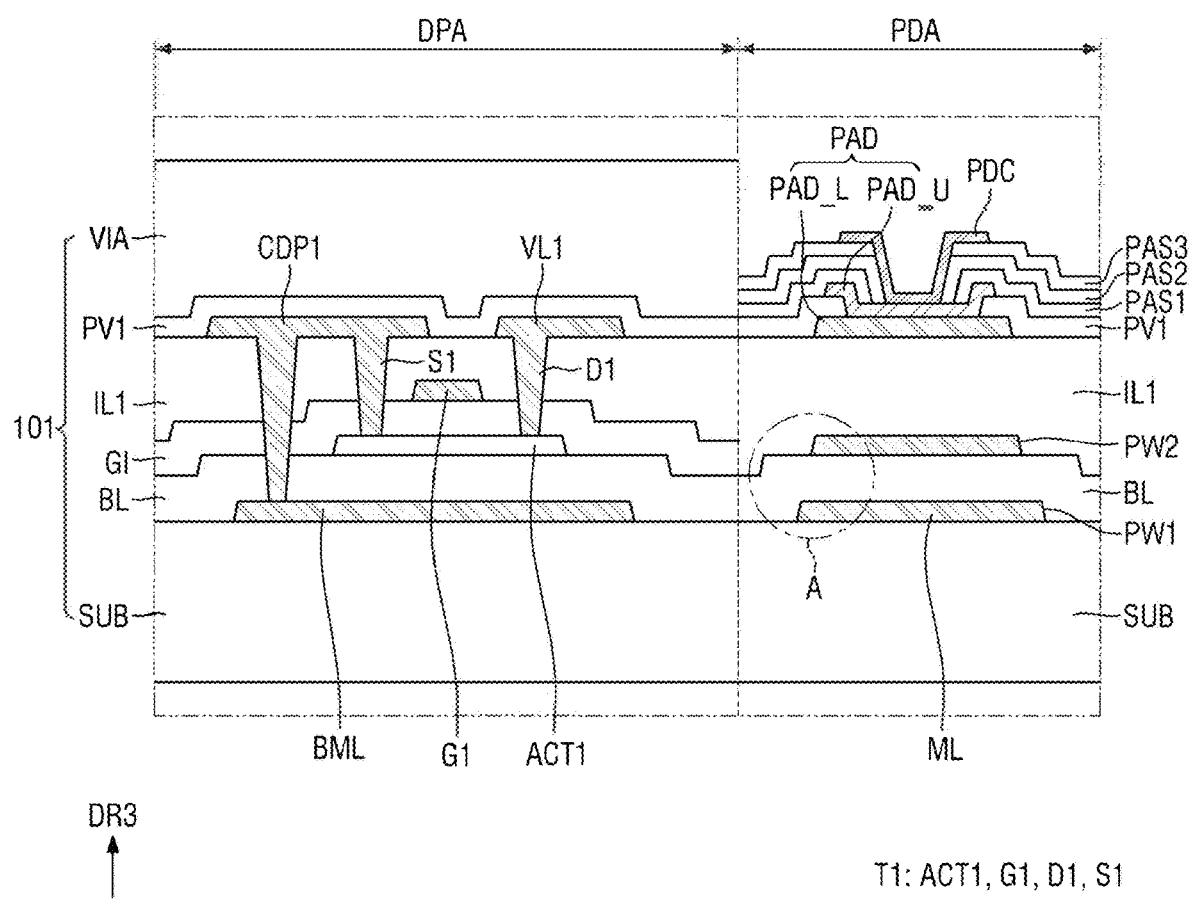
FIG. 8 is a cross-sectional view illustrating a first transistor and a pad electrode that are formed by multiple wires and conductive patterns provided in a wiring substrate of the display device of FIG. 1.
Figure 9:
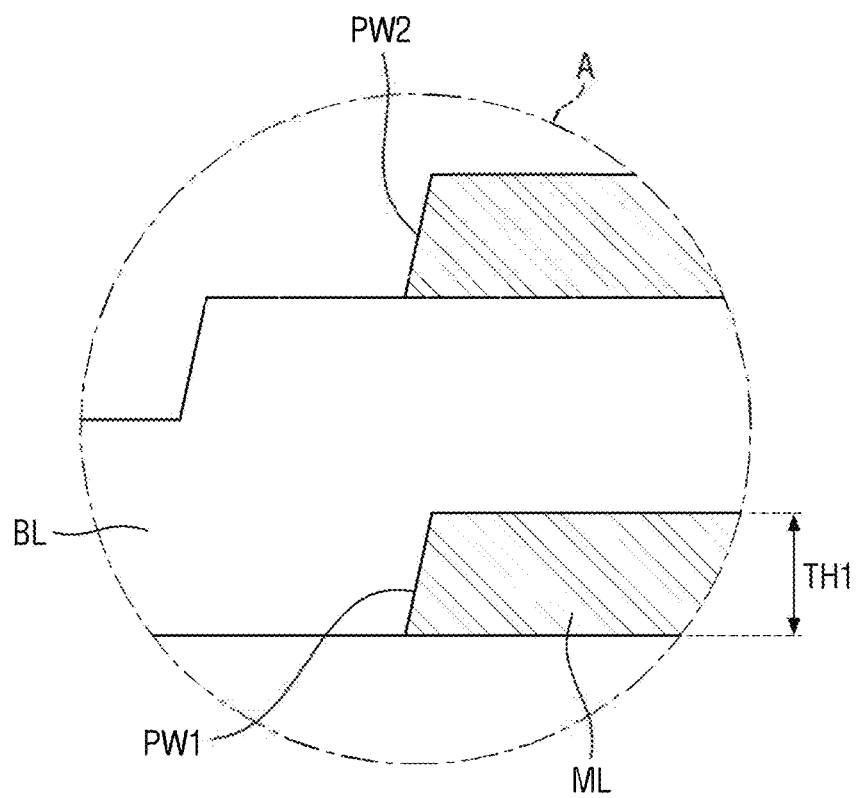
FIG. 9 is an enlarged cross-sectional view of part A of FIG. 8.

FIG. 8 is a cross-sectional view illustrating a first transistor and a pad electrode that are formed by multiple wires and conductive patterns provided in the wiring substrate of the display device of FIG. 1. FIG. 9 is an enlarged cross-sectional view of part A of FIG. 8. FIGS. 8 and 9 illustrate a first transistor T1, which is provided in the display area DPA of the display device 10, and a plurality of pad wires (PW1 and PW2), which are provided in the pad area PDA of the display device 10. FIGS. 8 and 9 illustrate, in further detail, the structure of each conductive layer included in the wiring substrate 101.

Referring to FIGS. 8 and 9 and further to FIGS. 5 and 6, the display device 10 may include the pad wires (PW1 and PW2), the pad electrode PAD, and a pad electrode capping layer PDC, which are provided in the pad area PDA. The pad wires (PW1 and PW2) and a pad electrode base layer PAD_L of the pad electrode PAD may be formed of the first through third conductive layers of the wiring substrate 101.

For example, the pad wires (PW1 and PW2) may include first and second pad wires PW1 and PW2. The first pad wire PW1 may be provided directly on the first substrate SUB, and the second pad wire PW2 may be provided directly on the buffer layer BL. The first pad wire PW1 may be formed of the first conductive layer, in the pad area PDA of the wiring substrate 101, and the second pad wire PW2 may be formed of the second conductive layer, in the pad area PDA of the wiring substrate 101.

The first pad wire PW1 and the lower metal layer BML in the display area DPA may be formed at the same time (e.g., concurrently) and may include the same material. The second pad wire PW2 and first and second gate electrodes G1 and G2 in the display area DPA may be formed at the same time (e.g., concurrently) and may include the same material. The first and second pad wires PW1 and PW2 are illustrated as overlapping with each other in a thickness direction, but the present disclosure is not limited thereto. In some embodiments, the first and second pad wires PW1 and PW2 may be electrically connected to one of the wires of each of the first through third conductive layers, and at least one of the first and second pad wires PW1 and PW2 may be electrically connected to the pad electrode PAD, which is provided above the first and second pad wires PW1 and PW2.

The pad electrode PAD may be provided in the pad area PDA of the wiring substrate 101 and may be connected to one of the wire pads WPD. In one or more embodiments, the pad electrode PAD may be electrically connected to one of the wires provided in the display area DPA, and electric signals applied from the wire pads WPD may be transmitted to the wires in the display area DPA through the pad electrode PAD.

The pad electrode PAD may include the pad electrode base layer PAD_L and a pad electrode upper layer PAD_U, which is provided on the pad electrode base layer PAD_L. The pad electrode base layer PAD_L may be provided directly on the first interlayer insulating layer IL1, and the pad electrode upper layer PAD_U may be provided directly on the first passivation layer PV1. The via layer VIA of the wiring substrate 101 may be provided in the display area DPA, but not in the pad area PDA. The pad electrode base layer PAD_L may be formed of the third conductive layer, and the pad electrode base layer PAD_L and the first conductive pattern CDP1 in the display area DPA may be formed at the same time (e.g., concurrently) and may include the same material.

The via layer VIA may not be provided, but exposed on the first passivation layer PV1, in the pad area PDA. The pad electrode upper layer PAD_U and the electrodes RME in the display area DPA may be formed at the same time (e.g., concurrently) and may include the same material. In the pad area PDA, the first insulating layer PAS1 may be provided directly on the pad electrode upper layer PAD_U and the first passivation layer PV1, and the second and third insulating layers PAS2 and PAS3 may be sequentially provided on the first insulating layer PAS1.

The pad electrode capping layer PDC may be provided on the third insulating layer PAS3, in the pad area PDA of the wiring substrate 101. The pad electrode capping layer PDC and one of the connecting electrodes CNE in the display area DPA may be formed at the same time (e.g., concurrently) and may include the same material. The pad electrode capping layer PDC may be in direct contact with, and electrically connected to, the pad electrode upper layer PAD_U through a contact hole, which penetrates the first through third insulating layers PAS1 through PAS3. The pad electrode capping layer PDC may be provided on the pad electrode PAD to protect, and be electrically connected to, the pad electrode PAD. The wire pads WPD may be provided on the pad electrode capping layer PDC.

At least one of the wires or conductive patterns of each of the first through third conductive layers of the wiring substrate 101 of the display device 10 may include a metal layer ML formed of a Cu alloy. For example, the lower metal layer BML and the first pad wire PW1 of the first conductive layer may each include a metal layer ML formed of a Cu alloy, the first gate electrode G1, the second pad wire PW2 of the second conductive layer and the first conductive pattern CDP1, the first voltage line VL1, and the pad electrode base layer PAD_L of the third conductive layer may each include a metal layer ML formed of a Cu alloy. The wires and/or conductive patterns of each of the first through third conductive layers of the wiring substrate 101 may each include a metal layer ML formed of a Cu alloy. In some embodiments, the wires and/or conductive patterns of at least one of the first through third conductive layers of the wiring substrate 101 may each include a metal layer ML formed of a Cu alloy, and the wires and/or conductive patterns of the other conductive layer(s) of the wiring substrate 101 may not include any metal layers ML. The metal layers ML may be provided directly on the first substrate SUB1, the first gate insulating layer GI, or the first interlayer insulating layer IL1. The bottom surfaces of the metal layers ML may adjoin the top surface of the first substrate SUB, the first gate insulating layer GI, and/or the first interlayer insulating layer IL1.

The metal layers ML may include a Cu alloy and may have a crystal grain size of 140 nm or less and a specific resistivity (e.g., electric resistivity) of 2.3 $\mu\Omega$cm or less.

The first through third conductive layers of the wiring substrate 101 may be obtained by depositing and then patterning the material of the metal layers ML. Each of the first through third conductive layers of the wiring substrate 101 may be patterned by an etching process using a non-peroxide-based etchant composition. In this case, there may arise a difference in etching rate with respect to the etchant composition between the inside of the crystal grains of the material of the metal layers ML and the grain boundaries of the material of the metal layers ML. As a result, the wires and/or conductive patterns of each of the first through third conductive layers may be patterned along the grain boundaries of the material of the metal layers ML.

In a case where the wires and/or conductive patterns of each of the first through third conductive layers of the wiring substrate 101 include the metal layers ML, the wiring substrate 101 may have a crystal grain size of 140 nm or less and may have suitably smooth surfaces because etched surfaces are formed with small roughness along the grain boundaries of the material of the metal layers ML. For example, wires extending in one direction, among the wires of each of the first through third conductive layers of the wiring substrate 101, may be patterned by the etchant composition to have suitably smooth sides, and as a result, the straightness of the wires can be improved.

The wires and/or conductive patterns of each of the first through third conductive layers of the wiring substrate 101 may be patterned by the etchant composition to have tapered sides, and the sides of each of the first through third conductive layers may have a set or predetermined taper angle with respect to the top surface of the underlying layer. As the metal layers ML have a relatively small crystal grain size, the etched surfaces of the wires and/or conductive patterns of each of the first through third conductive layers can be formed to be suitably smooth, and any differences in taper angle between the sides of each of the first through third conductive layers can be reduced. Accordingly, any step coverage defects that may occur on an insulating film on the first through third conductive layers of the wiring substrate 101, for example, on the buffer layer BL, which is provided on the first conductive layer, can be reduced. As the straightness of the wires and/or conductive patterns of each of the first through third conductive layers can be improved and any differences in taper angle between the sides of each of the first through third conductive layers can be reduced, short circuits and/or burnt defects that may be caused by low specific resistivity can be prevented or reduced.

At least one of the wires and/or conductive patterns of the wiring substrate 101 may include a metal layer ML formed of a CuAg alloy and may have a crystal grain size of 140 nm or less. In this case, the metal layers ML may have an Ag content of 3 at % or less or 1 at % or less. Impurity metals included in the CuAg alloy of the metal layers ML may infiltrate into the crystal grain boundaries of Cu to suppress or reduce the growth of Cu crystal grains. As a result, a Cu alloy mainly including Cu and having a set or predetermined impurity metal content may have a smaller crystal grain size than a pure Cu metal. In one or more embodiments where the metal layers ML are formed of a CuAg alloy having an impurity metal content of 3 at % or less, the metal layers ML may have a crystal grain size of 140 nm or less and a specific resistivity of 2.3 µΩcm.

A Cu alloy including Ag as an impurity may have different resistivities depending on the impurity content thereof. The lower the impurity content of a Cu alloy, the lower the specific resistivity of the Cu alloy. For example, a CuAg alloy having Ag as an impurity may have a specific resistivity of 2.3 µΩcm or less when its Ag content is 3 at % or 1 at % or less. A CuAg alloy having an Ag content of 1 at % may have a specific resistivity of 2.3 µΩcm or greater after the formation of the metal layers ML. A Cu alloy including Ag may have a specific resistivity of 2.3 µΩcm after being subjected to thermal treatment at a temperature of 400° C. for one hour.

As the metal layers ML of the first through third conductive layers of the wiring substrate 101 include a CuAg alloy, the metal layers ML may have a specific resistivity of 2.3 µΩcm or less and a crystal grain size of 140 nm or less. Accordingly, the wires of the wiring substrate 101 can have excellent or improved straightness.

Figure 10A:
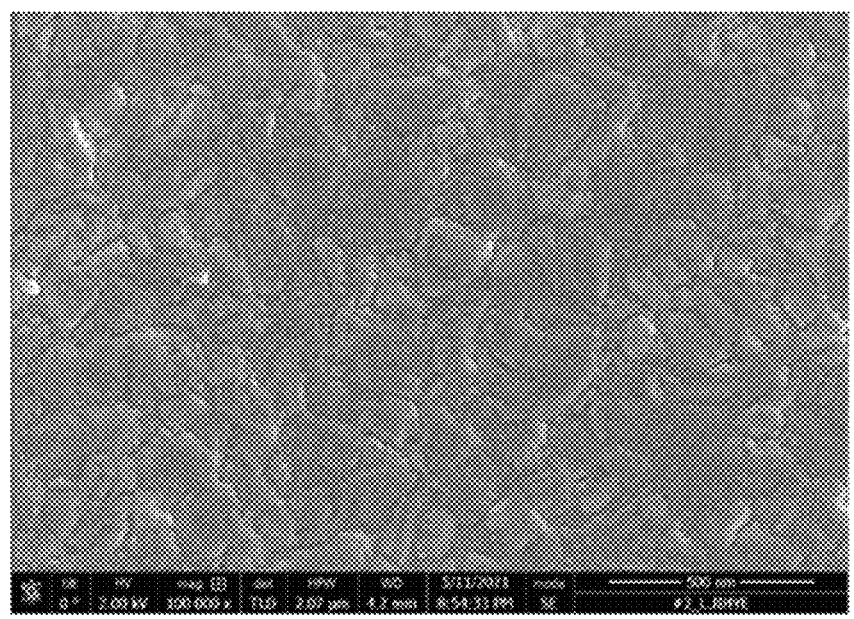
FIGS. 10A-12C are scanning electron microscope (SEM) images or focused ion beam (FIB) photographs showing wires or conductive patterns of conductive layers, respectively.
Figure 10B:
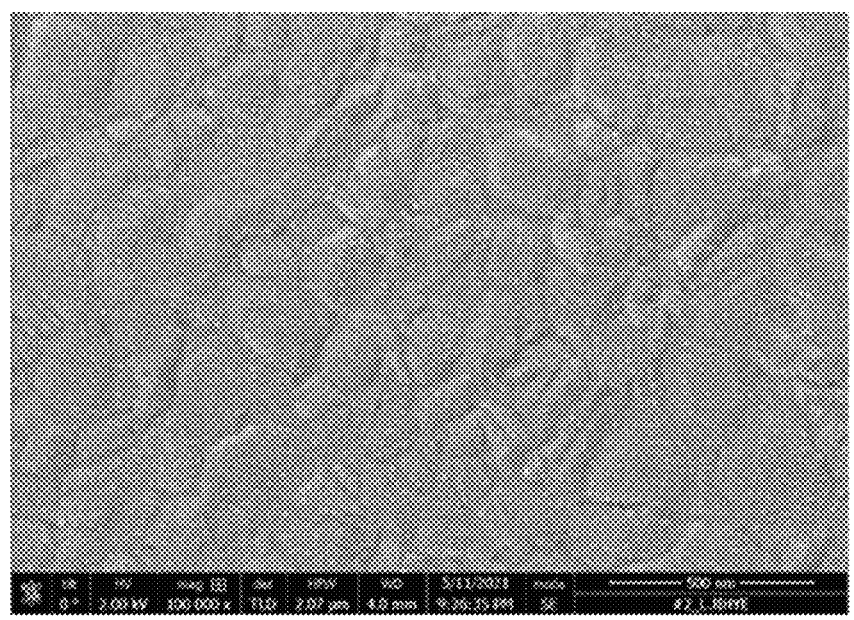
Figure 10C:
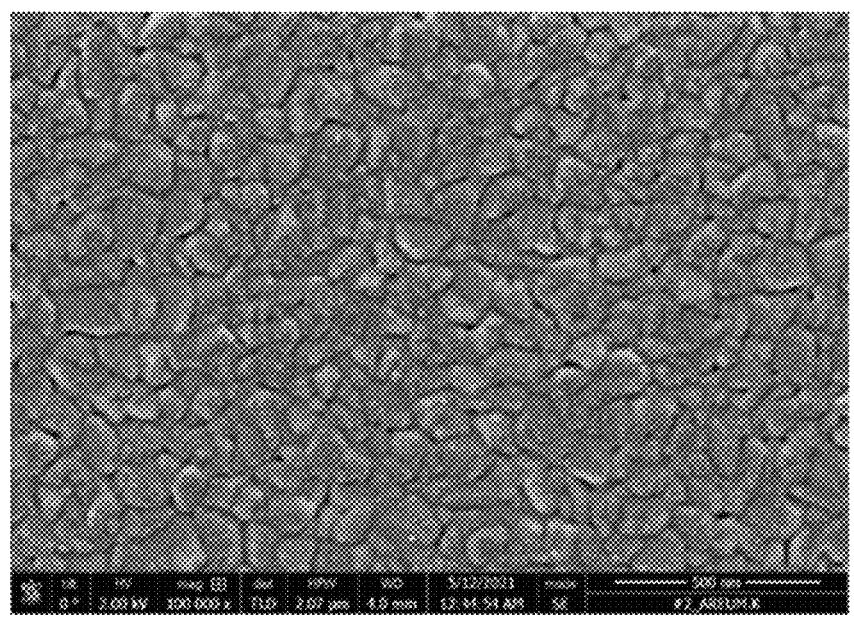
Figure 11A:
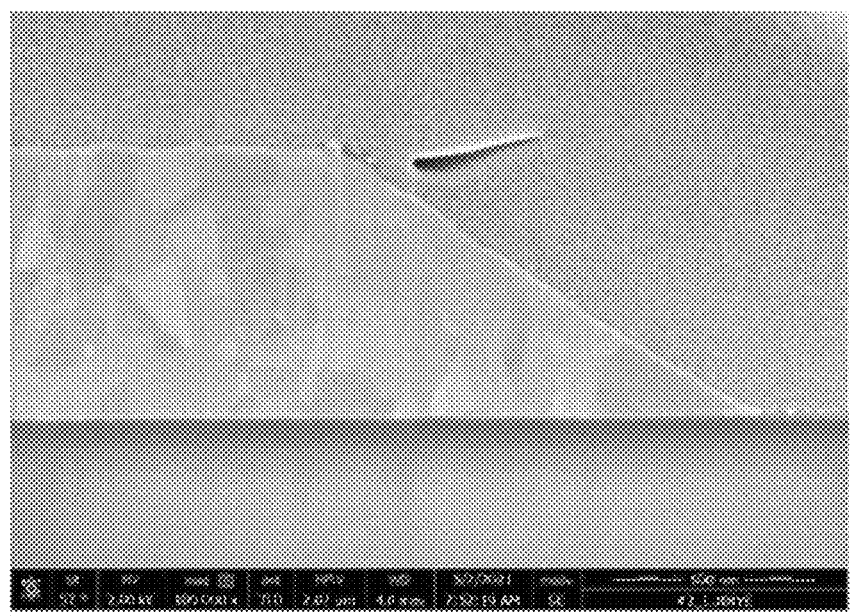
Figure 11B:
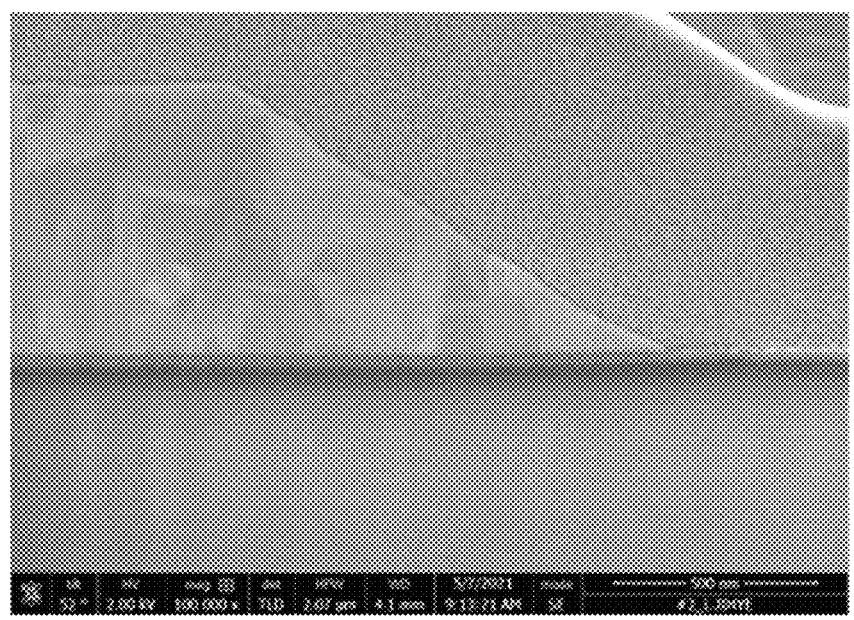
Figure 11C:
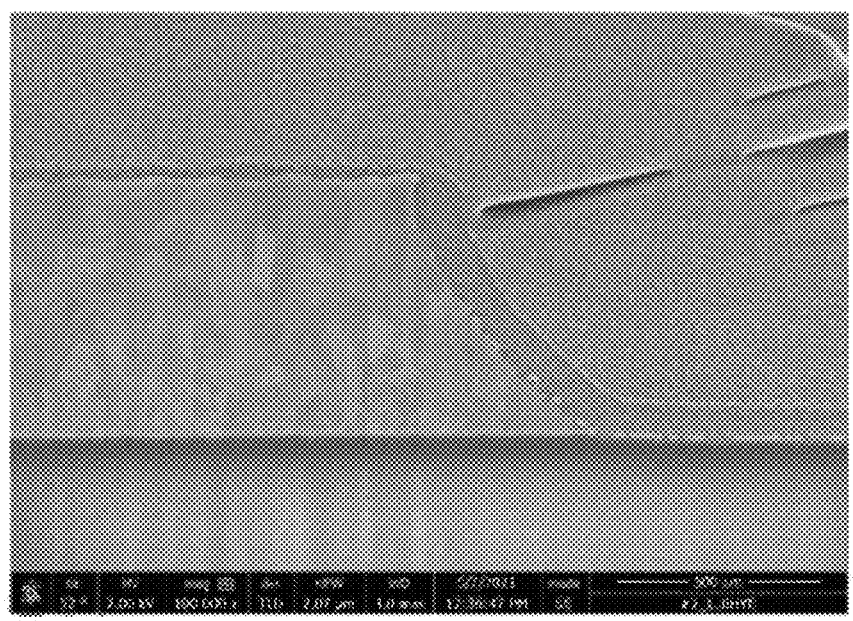
Figure 12A:
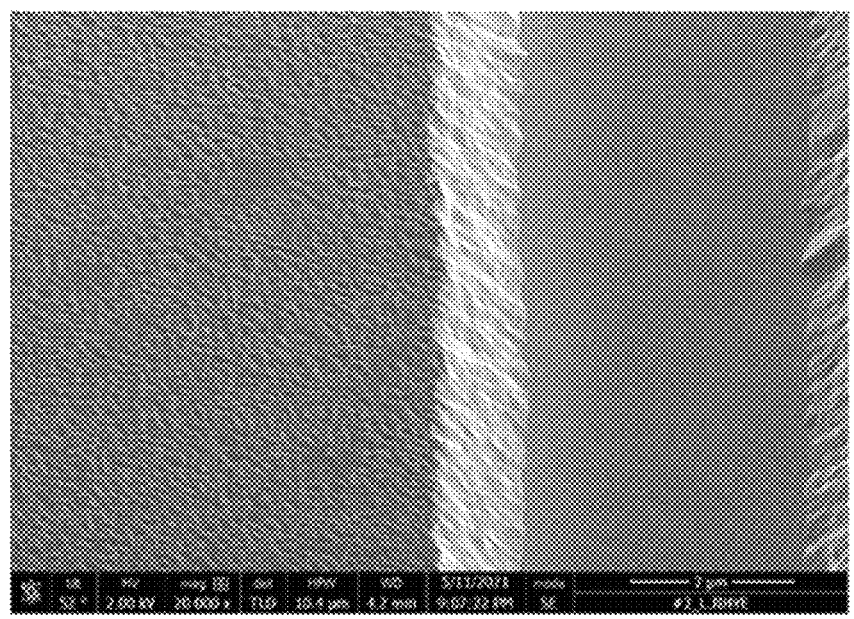
Figure 12B:
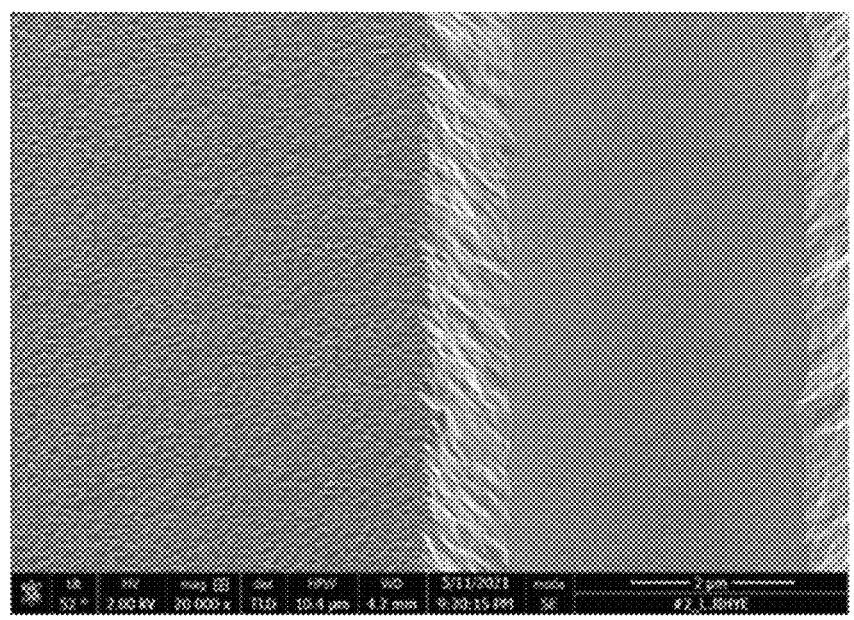
Figure 12C:
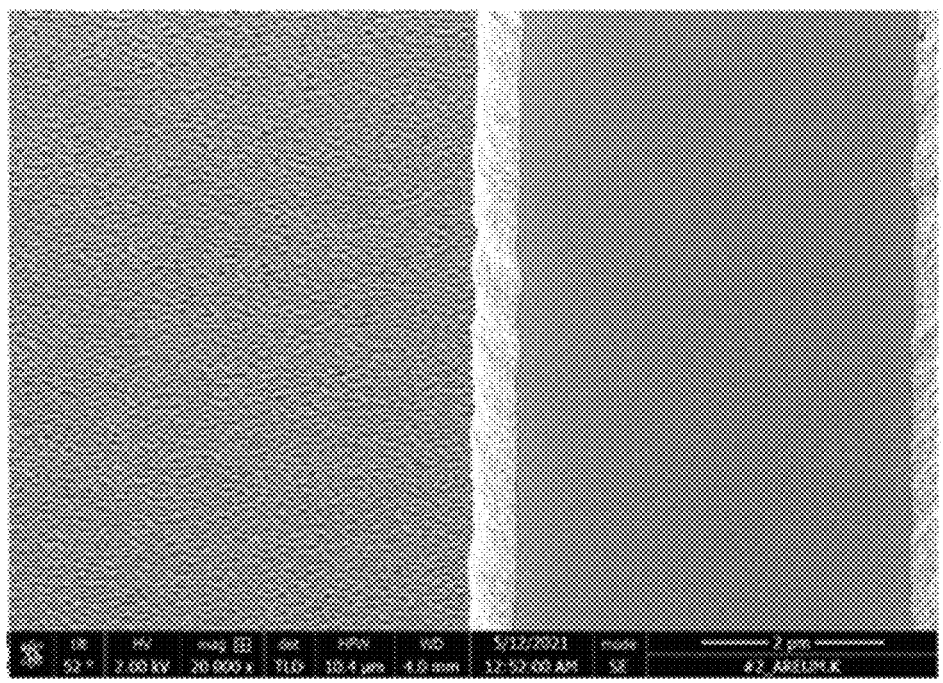

FIGS. 10A-12C are scanning electron microscope (SEM) images or focused ion beam (FIB) photographs showing wires and/or conductive patterns of conductive layers. FIGS. 10A-10C are SEM images showing the surfaces and crystal grain sizes of metal layers including Cu and having a thickness of 8000 Å. FIGS. 11A-11C are FIB photographs showing the cross-sections and crystal grain sizes of metal layers including Ti/Cu double films and having a thickness of 2000 Å/8000 Å, and FIGS. 12A-12C are FIB photographs showing the straightness of metal layers including a CuAg alloy and having a thickness of 8000 Å. FIGS. 10A-10C show the crystal grain sizes on the surfaces of metal layers, from above the wires of the metal layers, FIGS. 11A-11C show the crystal grain sizes on cross-sections of metal layers, and FIGS. 12A-12C show the straightness of wires of metal layers. The straightness of a wire may be determined based on the profile of a tapered side of the wire in the direction in which the wire extends. FIGS. 12A-12C show the tapered sides of wires in the direction in which the wires extend.

Referring to FIGS. 10A-12C, the metal layers including a CuAg alloy have a smaller crystal grain size than the metal layers including Cu or the metal layers including Ti/Cu double films. The metal layers including Cu have a crystal grain size of about 200 nm, the metal layers including Ti/Cu double films have a crystal grain size of about 194 nm, and the metal layers including a CuAg alloy have a crystal grain size of about 118 nm. A CuAg alloy may have a smaller crystal grain size than pure Cu or Ti/Cu. The wires of the metal layers including a CuAg alloy have low roughness on the surfaces thereof and have smoothly tapered sides. As the metal layers including a CuAg alloy have suitably smooth outer surfaces, any slope differences on the tapered sides of the wires of the metal layers including a CuAg alloy can be reduced, and the straightness of the tapered sides in the direction in which the wires extend can be improved. Accordingly, the wires and/or conductive patterns of each of the first through third conductive layers of the wiring substrate 101 of the display device 10 can become suitably smooth and have improved straightness, and short circuits and burnt defects that may occur in wires can be prevented or reduced.

As the metal layers ML of the wiring substrate 101 include a CuAg alloy, the metal layers ML may have a crystal grain size of 140 nm or less, a specific resistivity of 2.3 µΩcm, and a line edge roughness (LER) of 0.195 µm or less. The metal layers ML may have a relatively small crystal grain size and a relatively small LER value. Thus, as the metal layers ML can have suitably smooth surfaces and improved wire straightness, short circuits and burnt defects that may occur in wires can be prevented or reduced, and a limit voltage applied to wires can be heightened.

Figure 13:
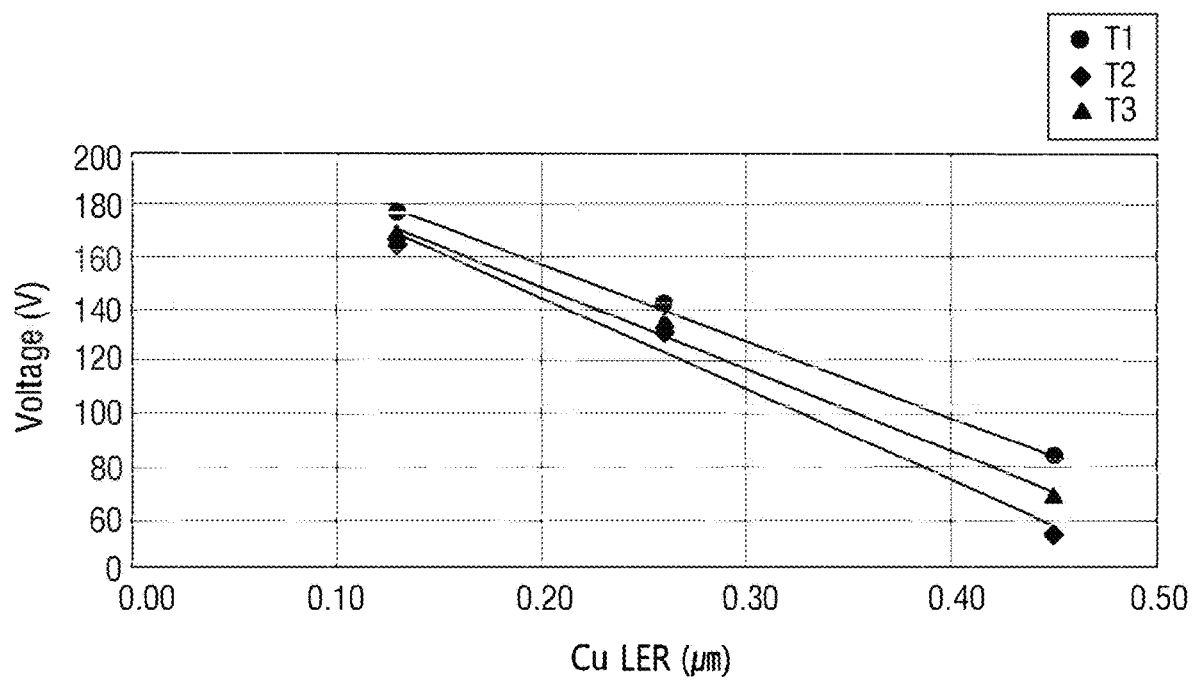
FIG. 13 is a graph of the limit voltage of wires versus the line edge roughness (LER) of conductive layers.

FIG. 13 is a graph of the limit voltage of wires versus the LER of conductive layers. FIG. 13 is a graph showing a breakdown voltage (MV/cm) at which an insulating layer covering each metal layers ML is destroyed by a voltage applied to the metal layers ML, versus the LER of the metal layers ML.

Referring to FIG. 13, the metal layers ML may have a LER of 0.195 µm and a limit voltage of 150 V or greater. As the metal layers ML include a CuAg alloy, the metal layers ML have a specific resistivity of 2.3 µΩcm. Also, as the wire straightness of the metal layers ML is improved, the durability of the metal layers ML against high voltage can be improved. As the wiring substrate 101 includes the metal layers ML, damage to the wiring substrate 101 while being driven at high voltage can be prevented or reduced.

Referring to FIGS. 12A-12C, LER may be calculated by placing a wire to fall in the middle of an image and measuring the distance from the edge of the image to the edge of the wire. For example, the LER of the wire may be calculated by measuring the distance from the edge of the image to the edge of the wire, at a number of locations (or points) on the wire, and calculating the difference between the maximum and minimum distance measurements. In the case of the metal layers ML, the distance between the edges of wires and the edges of images of the wires may be measured at 10 locations on the wires, and the difference between the sum of five maximum distance measurements and the sum of five minimum distance measurements may be 0.195 µm or less.

A thickness TH1 of the metal layers ML may be 2,000 Å to 20,000 Å. As the metal layers ML have a specific resistivity of 2.3 µΩcm or less and have a thickness of 2,000 Å to 20,000 Å, the metal layers ML may have a resistance required (or desired) of the wires and conductive patterns of each of the first through third conductive layers of the wiring substrate 101. For example, the metal layers ML may have a specific resistivity of 2.3 µΩcm or less, a thickness of about 8,000 Å, and a surface resistivity of 0.02 Ω/square to 0.03 Ω/square. In another example, the metal layers ML may have a specific resistivity of 2.3 µΩcm or less, a thickness of about 3,000 Å, and a surface resistivity of 0.06 Ω/square to 0.08 Ω/square. As the thickness TH1 of the metal layers ML is in the range of 2,000 Å to 20,000 Å, the wires of each of the first through third conductive layers can be formed to have excellent or improved physical properties, a crystal grain size of 140 nm or less, and suitably smooth surfaces, but the present disclosure is not limited thereto.

Display devices according to other embodiments of the present disclosure will hereinafter be described.

Figure 14:
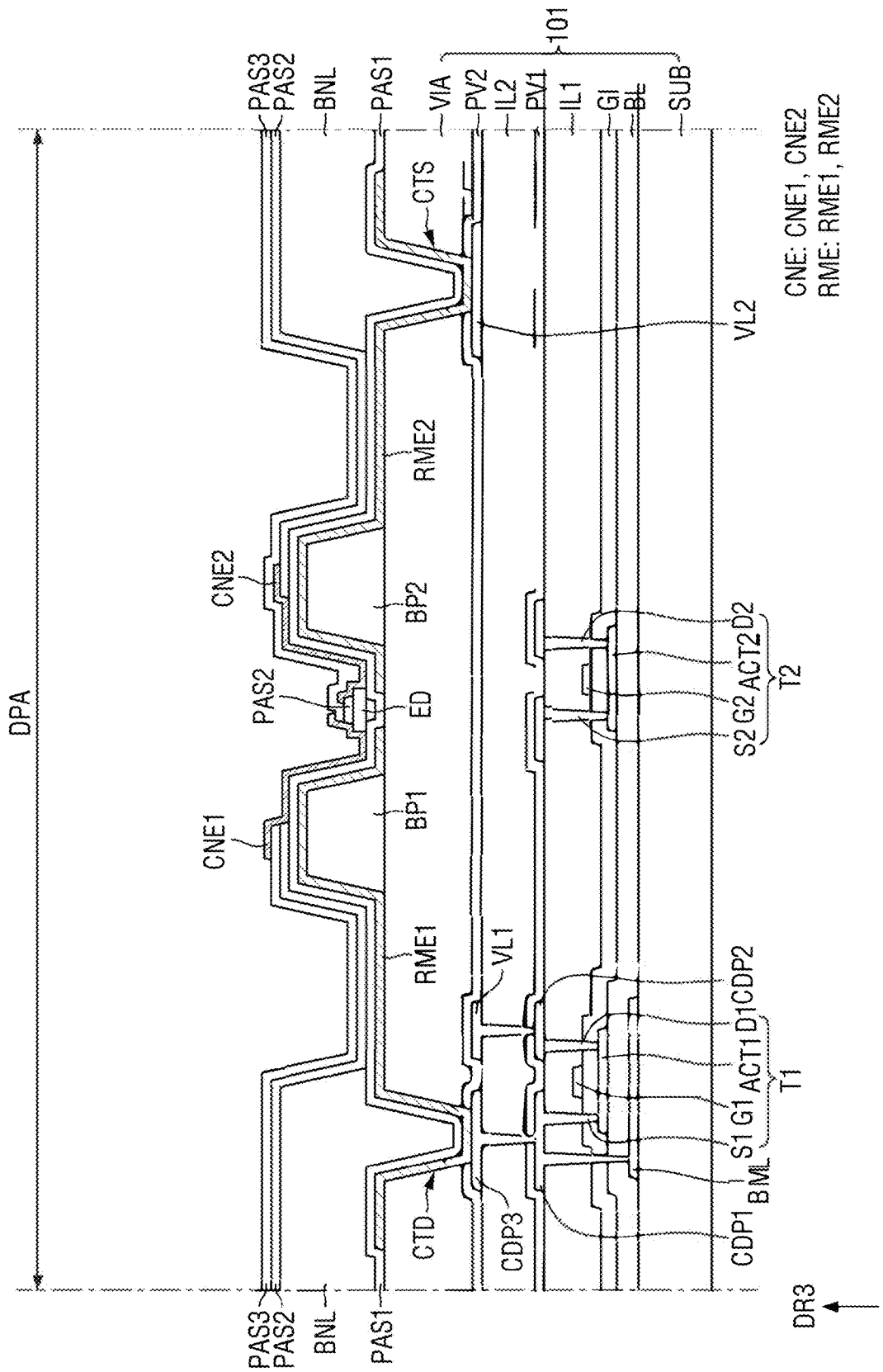
FIG. 14 is a cross-sectional view of portion of a display device according to one or more other embodiments of the present disclosure.

FIG. 14 is a cross-sectional view of portion of a display device according to one or more other embodiments of the present disclosure.

Referring to FIG. 14, a wiring substrate 101 of a display device 10 may further include a second interlayer insulating layer IL2, a fourth conductive layer, and a second passivation layer PV2, which are provided on a third conductive layer. The embodiment of FIG. 14 differs from the embodiment of FIG. 5 in that the wiring substrate 101 includes more than three conductive layers.

The wiring substrate 101 of the display device 10 may further include the second interlayer insulating layer IL2, which is provided on a first passivation layer PV1, the fourth conductive layer, which is provided on the second interlayer insulating layer IL2, and the second passivation layer PV2, which is provided on the fourth conductive layer. A via layer VIA may be provided on the second passivation layer PV2, and first and second electrode contact holes CTD and CTS may penetrate the via layer VIA and the second passivation layer PV2.

Wires and/or conductive patterns of the third conductive layer may be provided in different conductive layers. For example, the third conductive layer may include first and second conductive patterns CDP1 and CDP2, which serve as the source and drain electrodes of the first and second transistors T1 and T2, and the fourth conductive layer may include a first voltage line VL1, a second voltage line VL2, and a third conductive pattern CDP3.

The first and second conductive patterns CDP1 and CDP2 may serve as a first source electrode S1 and a first drain electrode D1, respectively, of the first transistor T1. A second source electrode S2 and a second drain electrode D2 of the second transistor T2 may also be formed of the third conductive layer.

The fourth conductive layer is provided above the third conductive layer. The first voltage line VL1 of the fourth conductive layer may be connected to the second conductive pattern CDP2 of the third conductive layer, and the third conductive pattern CDP3 of the fourth conductive layer may be connected to the first conductive pattern CDP1 of the third conductive layer. The first voltage line VL1 may be electrically connected to the first transistor T1 through the second conductive pattern CDP2, and a first electrode RME1 may be electrically connected to the first transistor T1 through the third conductive pattern CDP3. A second electrode RME2 may be directly connected to the second voltage line VL2 of the fourth conductive layer.

Each of the third and fourth conductive layers may include a metal layer ML described above with reference to FIG. 8. The wires and/or the conductive patterns of each of the third and fourth conductive layers may include metal layers ML of different materials and may thus have suitably smooth surfaces and improved straightness.

The second interlayer insulating layer IL2 may be provided between the third and fourth conductive layers. The second interlayer insulating layer IL2 may be provided on the first passivation layer PV1, which covers the third conductive layer, and the fourth conductive layer may be provided directly on the second interlayer insulating layer IL2. The second interlayer insulating layer IL2, like the first interlayer insulating layer IL1, may function as an insulating film between the third and fourth conductive layers, and may protect the third conductive layer.

The second passivation layer PV2 is provided on the fourth conductive layer. The second passivation layer PV2 may function as an insulating film between the fourth conductive layer and other layers and may protect the fourth conductive layer.

Figure 15:
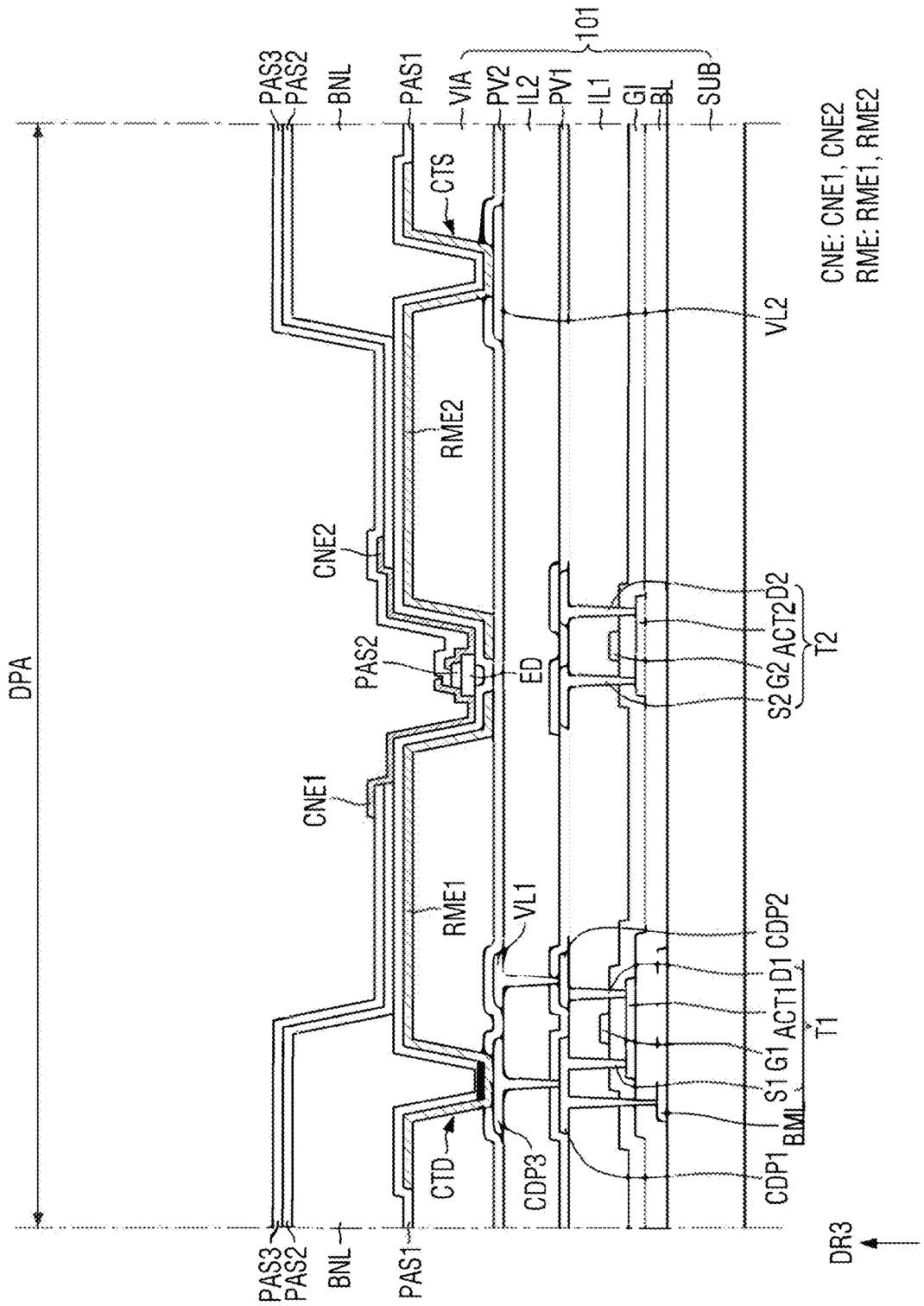
FIG. 15 is a cross-sectional view of portion of a display device according to one or more other embodiments of the present disclosure.

FIG. 15 is a cross-sectional view of portion of a display device according to one or more other embodiments of the present disclosure.

Referring to FIG. 15, a display device 10 does not include bank patterns (BP1 and BP2) on a via layer VIA, and the via layer VIA may include a trench where light-emitting elements ED are provided. A plurality of electrodes RME and a first insulating layer PAS1 may be provided in the trench of the via layer VIA, and the light-emitting elements ED may be provided on the first insulating layer PAS1, in the trench of the via layer VIA. The trench of the via layer VIA may form inclined sides on behalf of (e.g., akin to) bank patterns (BP1 and BP2), and the electrodes RME may be provided on the inclined sides of the trench of the via layer VIA so that light emitted by the light-emitting elements ED may be output in an upward direction.

The trench of the via layer VIA, like the first and second electrode contact holes CTD and CTS, may penetrate (e.g., may break up) the via layer VIA. The trench of the via layer VIA may expose the top surface of the second passivation layer PV2 below the via layer VIA, and portions of the electrodes RME and the first insulating layer PAS1 may be provided directly on the second passivation layer PV2.

The embodiment of FIG. 15 differs from the embodiment of FIG. 14 only in that the trench of the via layer VIA, instead of bank patterns (BP1 and BP2), is provided, and the light-emitting elements ED are provided in the trench of the via layer VIA.

Figure 16:
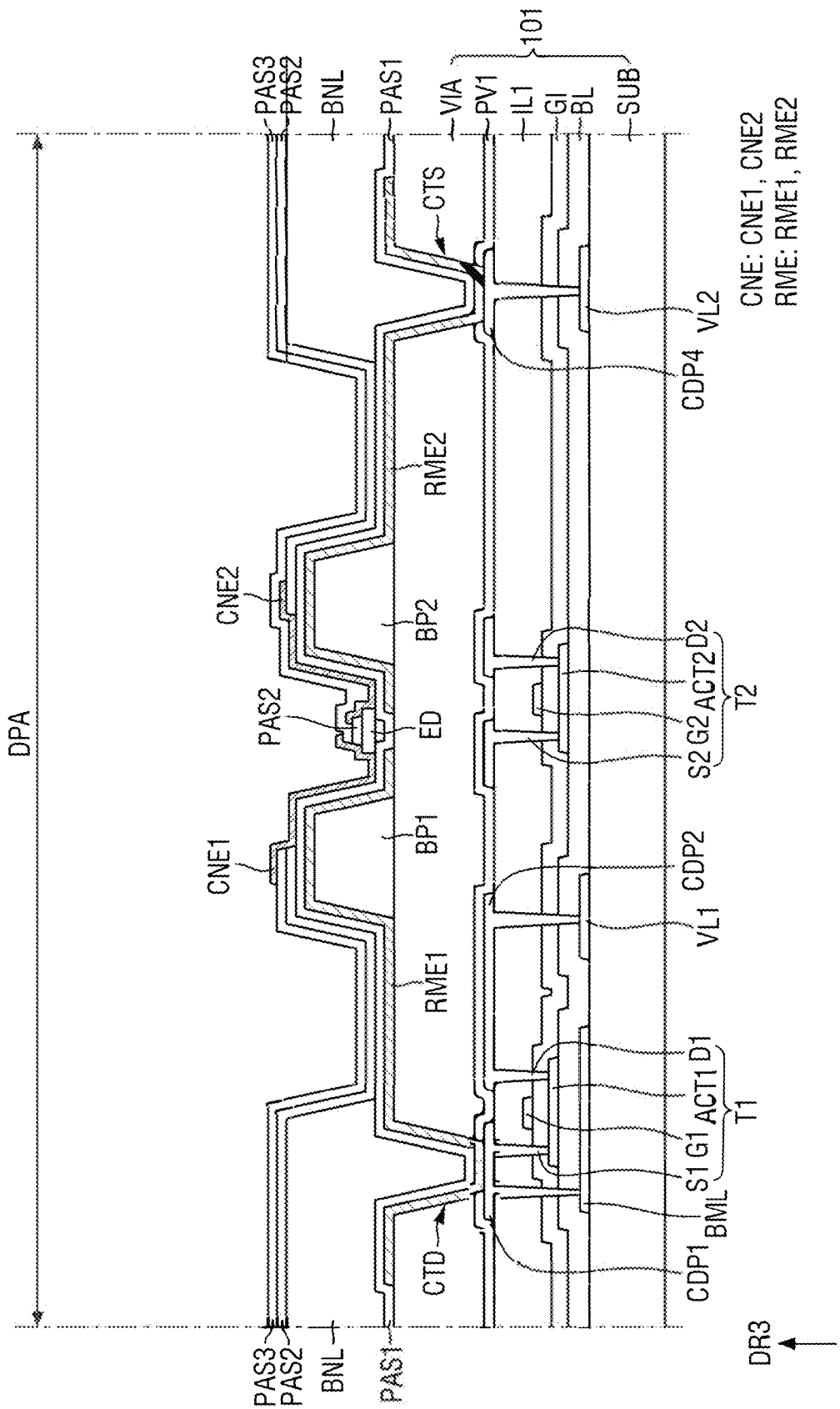
FIG. 16 is a cross-sectional view of portion of a display device according to one or more other embodiments of the present disclosure.

FIG. 16 is a cross-sectional view of portion of a display device according to one or more other embodiments of the present disclosure.

Referring to FIG. 16, first and second voltage lines VL1 and VL2 may be formed of a first conductive layer, and a third conductive layer may further include second and fourth conductive patterns CDP2 and CDP4. The embodiment of FIG. 16 differs from the embodiment of FIG. 5 in that the first and second voltage lines VL1 and VL2 are formed of the first conductive layer, rather than the third conductive layer, and the third conductive layer further includes the second and fourth conductive patterns CDP2 and CDP4, which electrically connect the first and second voltage lines VL1 and VL2 to a first transistor T1 and a second electrode RME2, respectively.

The first and second voltage lines VL1 and VL2 may be formed of the first conductive layer and may include the metal layers ML described above with reference to FIG. 8.

The third conductive layer may include the second conductive pattern CDP2, which is connected to the first voltage line VL1. The second conductive pattern CDP2 may function as a first drain electrode D1 of the first transistor T1 and may be directly connected to the first voltage line VL1. The first voltage line VL1 may be electrically connected to the first transistor T1 through the second conductive pattern CDP2. The third conductive layer may include the fourth conductive pattern CDP4, which is connected to the second voltage line VL2. The fourth conductive pattern CDP4 may be connected to the second electrode RME and the second voltage line VL2, and the second electrode RME2 may be electrically connected to the second voltage line VL2 through the fourth conductive pattern CDP4.

The second and fourth conductive patterns CDP2 and CDP4 may include the metal layers ML described above with reference to FIGS. 5 through 8.

Figure 17:
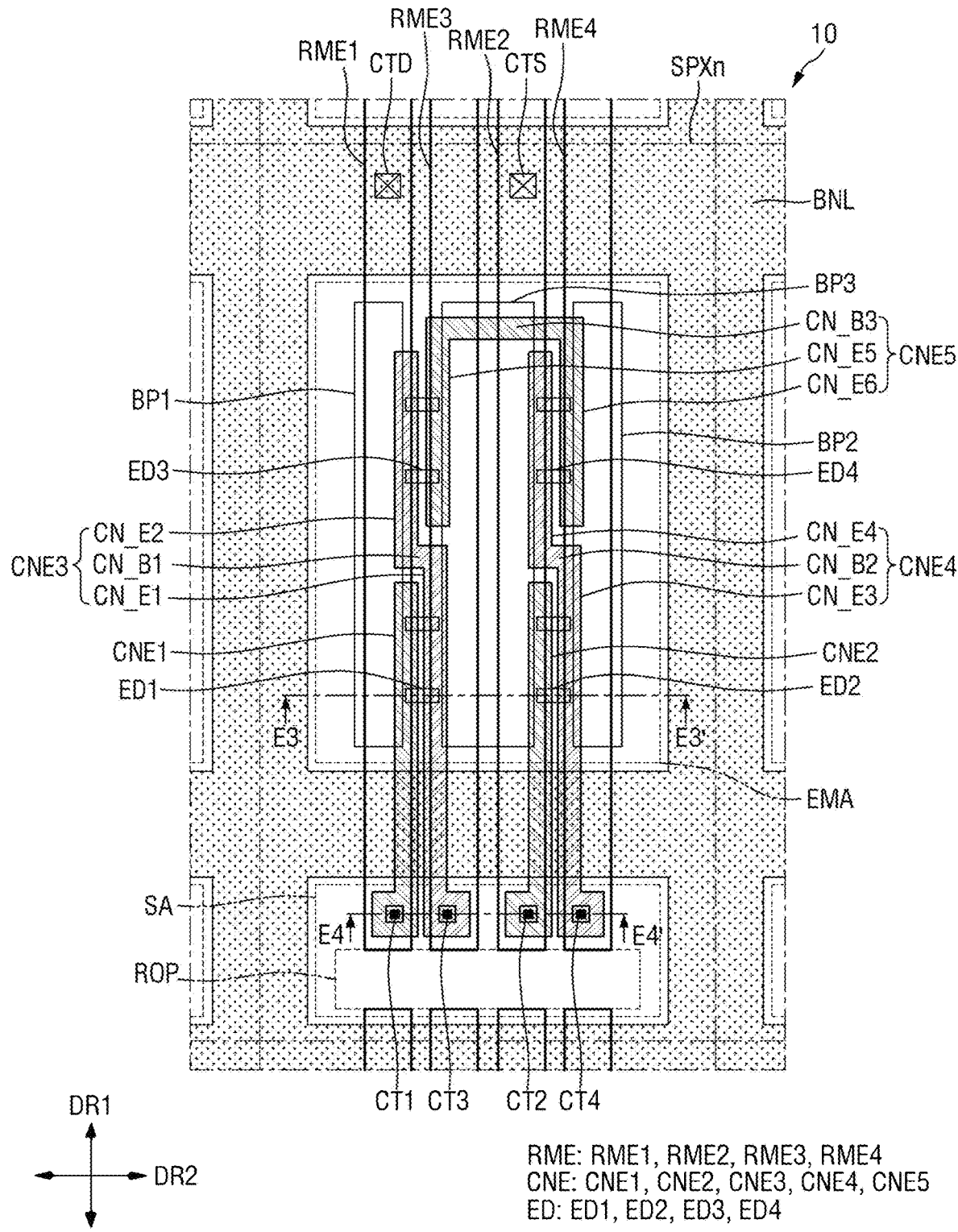
FIG. 17 is a plan view of a subpixel of a display device according to one or more other embodiments of the present disclosure.
Figure 18:
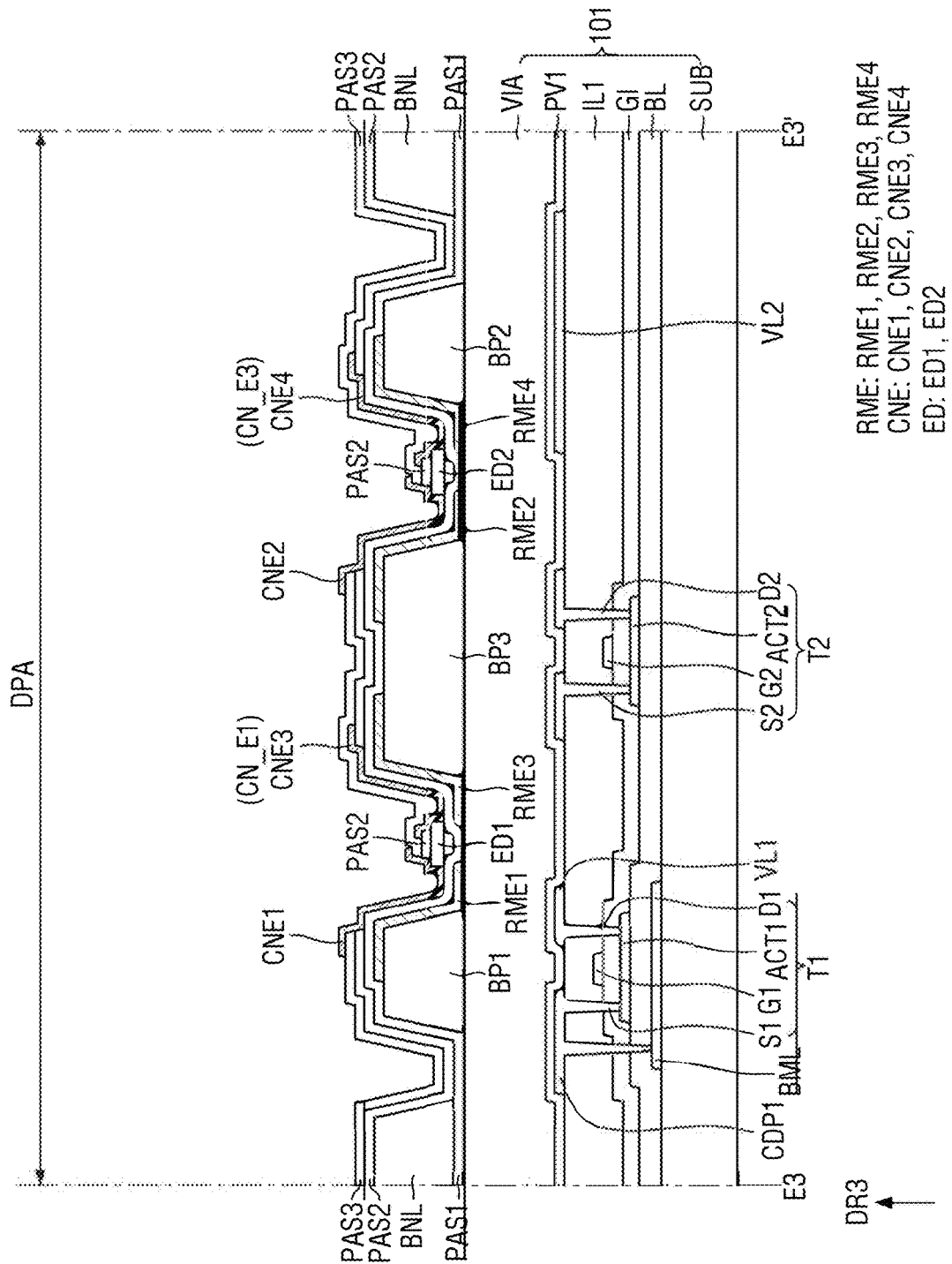
FIG. 18 is a cross-sectional view taken along line E3-E3' of FIG. 17.
Figure 19:
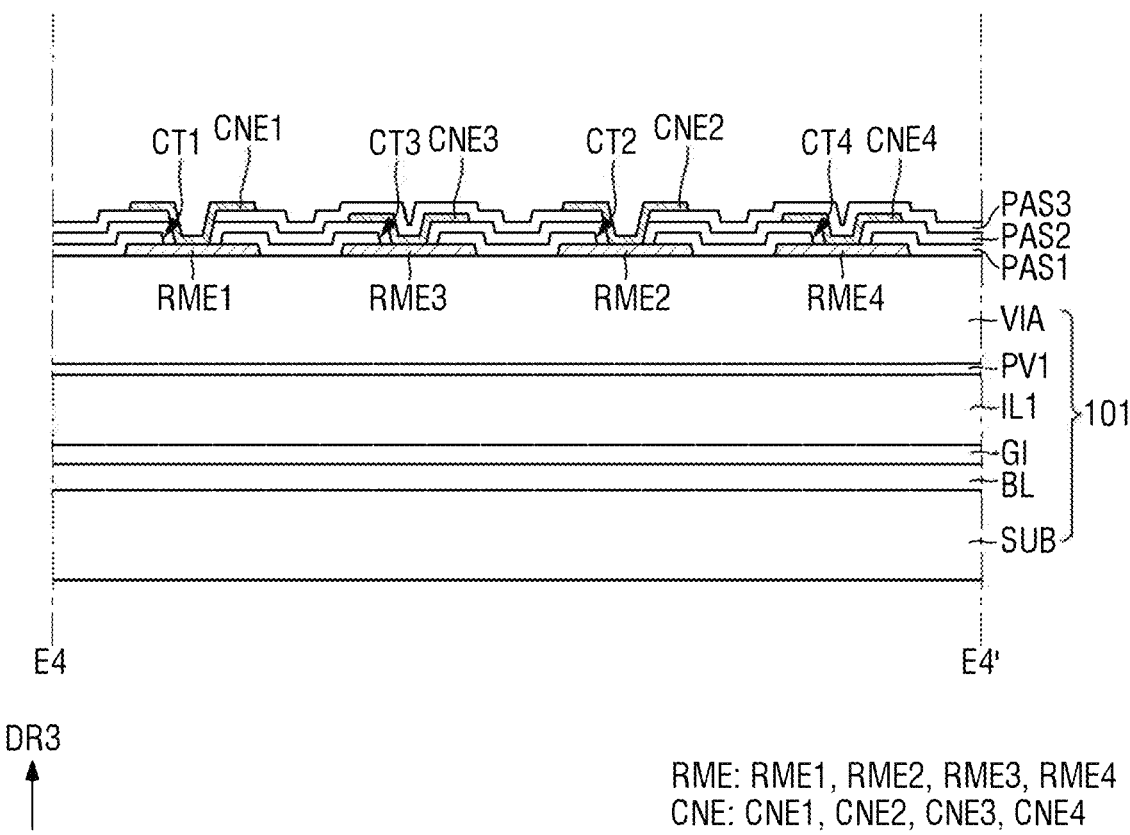
FIG. 19 is a cross-sectional view taken along line E4-E4' of FIG. 17.

FIG. 17 is a plan view of a subpixel of a display device according to one or more other embodiments of the present disclosure. FIG. 18 is a cross-sectional view taken along line E3-E3' of FIG. 17. FIG. 19 is a cross-sectional view taken along line E4-E4' of FIG. 17. FIG. 17 illustrates the layout of electrodes RME, bank patterns (BP1 through BP3), a bank layer BNL, a plurality of light-emitting elements ED, and connecting electrodes CNE in a pixel PX of a display device 10. FIG. 18 illustrates a cross-sectional view taken across both end portions of each of a pair of light-emitting elements ED on different electrodes RME, and FIG. 19 illustrates a cross-sectional view taken across a plurality of first through fourth contacts CT1 through CT4.

Referring to FIGS. 17 through 19, the display device 10 may include more electrodes RME, more bank patterns (BP1 through BP3), more light-emitting elements ED, and more connecting electrodes CNE in each subpixel SPXn than the display device according to the embodiments of FIG. 4. The embodiment of FIG. 17 differs from the embodiment of FIG. 4 in that larger numbers of electrodes RME and light-emitting elements ED are provided. The embodiment of FIG. 17 will hereinafter be described, focusing mainly on the differences with respect to the embodiment of FIG. 4.

The bank patterns (BP1 through BP3) may include first and second bank patterns BP1 and BP2 and may further include a third bank pattern BP3, which is provided between the first and second bank patterns BP1 and BP2. The first bank pattern BP1 may be provided on the left side of the center of an emission area EMA of a subpixel SPXn, the second bank pattern BP2 may be provided on the right side of the center of the emission area EMA, and the third bank pattern BP3 may be provided in the middle of the emission area EMA. The third bank pattern BP3 may have a larger width than the first and second bank patterns BP1 and BP2 in a second direction DR2. The distance between the adjacent bank patterns (BP1 through BP3) may be greater than the distance between the electrodes RME. The first bank pattern BP1 may be provided to partially overlap with a first electrode RME1, and the second bank pattern BP2 may be provided to partially overlap with a fourth electrode RME4. The third bank pattern BP3 may be provided to partially overlap with second and third electrodes RME2 and RME3. The electrodes RME may be provided not to overlap, at least partially, with the bank patterns (BP1 through BP3).

The electrodes RME may include the first and second electrodes RME1 and RME2 and may further include the third and fourth electrodes RME3 and RME4.

The third electrode RME3 may be provided between the first and second electrodes RME1 and RME2, and the fourth electrode RME4 may be spaced apart from the third electrode RME3 in the second direction DR2 with the second electrode RME2 interposed therebetween. The electrodes RME may be arranged in the order of the first, third, second, and fourth electrodes RME1, RME3, RME2, and RME4 along a left-to-right direction. The electrodes RME may be spaced apart from, and face, one another in the second direction DR2. The electrodes RME of the subpixel SPXn may be spaced apart from electrodes RME of a neighboring subpixel SPXn, in a first direction DR1, in a separation part ROP of a subarea SA of the subpixel SPXn.

The first and second electrodes RME1 and RME2, but not the third and fourth electrodes RME3 and RME4, may be in contact with a first conductive pattern CDP1 and a second voltage line VL2, respectively, through first and second electrode contact holes CTD and CTS, respectively, below the bank layer BNL.

A first insulating layer PAS1 may be arranged in a similar layout to its counterpart of any one of the previous embodiments. The first insulating layer PAS1 may be provided in an entire display area DPA and may cover the electrodes RME and the bank patterns (BP1 through BP3).

The light-emitting elements ED may be provided between the bank patterns (BP1 through BP3) or on different electrodes RME. Some of the light-emitting elements ED may be provided between the first and third bank patterns BP1 and BP3, and other light-emitting elements ED may be provided between the second and third bank patterns BP2 and BP3. The light-emitting elements ED may include first light-emitting elements ED1 and third light-emitting elements ED3, which are provided between the first and third bank patterns BP1 and BP3, and second light-emitting elements ED2 and fourth light-emitting elements ED4, which are provided between the second and third bank patterns BP2 and BP3. The first light-emitting elements ED1 and the third light-emitting elements ED3 may be provided on the first and third electrodes RME1 and RME3, and the second light-emitting elements ED2 and the fourth light-emitting elements ED4 may be provided on the second and fourth electrodes RME2 and RME4. The first light-emitting elements ED1 and the second light-emitting elements ED2 may be provided in a lower portion of the emission area EMA, near the subarea SA, and the third light-emitting elements ED3 and the fourth light-emitting elements ED4 may be provided in an upper portion of the emission area EMA.

The light-emitting elements ED may be classified into different groups not according to their locations in the emission area EMA, but according to which of the connecting electrodes CNE they are each connected to. The light-emitting elements ED may be in contact with different connecting electrodes CNE and may be classified into different groups according to which of the connecting electrodes CNE they are each in contact with.

The connecting electrodes CNE may include first and second connecting electrodes CNE1 and CNE2, which are provided on the first and second electrodes RME1 and RME2, respectively, and may further include third, fourth, and fifth connecting electrodes CNE3, CNE4, and CNE5, which are each provided over multiple electrodes RME.

In the embodiment of FIG. 17, unlike in the embodiments of FIGS. 4 through 6, the first and second connecting electrodes CNE1 and CNE2 may be relatively short in the first direction DR1. The first and second connecting electrodes CNE1 and CNE2 may be provided on the lower side and towards the center of the emission area EMA. The first and second connecting electrodes CNE1 and CNE2 may be provided in and across the emission area EMA and the subarea SA and may be in direct contact with the electrodes RME through the first and second contacts CT1 and CT2, respectively, which are formed in the subarea SA. The first connecting electrode CNE1 may be in direct contact with the first electrode RME1 through the first contact CT1, which penetrates the first insulating layer PAS1 and second and third insulating layers PAS2 and PAS3, in the subarea SA, and the second connecting electrode CNE2 may be in direct contact with the second electrode RME2 through the second contact CT2, which penetrates the first through third insulating layers PAS1 through PAS3, in the subarea SA.

The third connecting electrode CNE3 may include a first extension CN_E1, which is provided on the third electrode RME3, a second extension CN_E2, which is provided on the first electrode RME1, and a first connector CN_B1, which connects the first and second extensions CN_E1 and CN_E2. The first extension CN_E1 may be spaced apart from, and face, the first connecting electrode CNE1 in the second direction DR2, and the second extension CN_E2 may be spaced apart from the first connecting electrode CNE1 in the first direction DR1. The first extension CN_E1 may be provided in the lower portion of the emission area EMA, and the second extension CN_E2 may be provided in the upper portion of the emission area EMA. The first and second extensions CN_E1 and CN_E2 may be provided in the emission area EMA. The first connector CN_B1 may be provided over the first and third electrodes RME1 and RME3, in the middle (or substantially in the middle) of the emission area EMA. The third connecting electrode CNE3 may generally extend in the first direction DR1, be bent in the second direction DR2, and extend back (e.g., again) in the first direction DR1.

The fourth connecting electrode CNE4 may include a third extension CN_E3, which is provided on the fourth electrode RME4, a fourth extension CN_E4, which is provided on the second electrode RME2, and a second connector CN_B2, which connects the third and fourth extensions CN_E3 and CN_E4. The third extension CN_E3 may be spaced apart from, and face, the second connecting electrode CNE2 in the second direction DR2, and the fourth extension CN_E4 may be spaced apart from the second connecting electrode CNE2 in the first direction DR1. The third extension CN_E3 may be provided in the lower portion of the emission area EMA, and the fourth extension CN_E4 may be provided in the upper portion of the emission area EMA. The third and fourth extensions CN_E3 and CN_E4 may be provided in the emission area EMA. The second connector CN_B2 may be provided over the second and fourth electrodes RME2 and RME4, in the middle (or substantially in the middle) of the emission area EMA. The fourth connecting electrode CNE4 may generally extend in the first direction DR1, be bent in the second direction DR2, and extend back (e.g., again) in the first direction DR1.

The fifth connecting electrode CNE5 may include a fifth extension CN_E5, which is provided on the third electrode RME3, a sixth extension CN_E6, which is provided on the fourth electrode RME4, and a third connector CN_B3, which connects the fifth and sixth extensions CN_E5 and CN_E6. The fifth extension CN_E5 may be spaced apart from, and face, the second extension CN_E2 of the third connecting electrode CNE3 in the second direction DR2, and the sixth extension CN_E6 may be spaced apart from, and face, the fourth extension CN_E4 of the fourth connecting electrode CNE4 in the second direction DR2. The fifth and sixth extensions CN_E5 and CN_E6 may be provided in the upper portion of the emission area EMA, and the third connector CN_B3 may be provided over the second, third, and fourth electrodes RME2, RME3, and RME4. The fifth connecting electrode CNE5 may surround the fourth extension CN_E4 of the fourth connecting electrode CNE4 in a plan view.

The third connecting electrode CNE3 may be in direct contact with the third electrode RME3 through the third contact CT3, which penetrates the first and second insulating layers PAS1 and PAS2, in the subarea SA, and the fourth connecting electrode CNE4 may be in contact with the fourth electrode RME4 through the fourth contact CT4, which penetrates the first and second insulating layers PAS1 and PAS2, in the subarea SA.

However, the present disclosure is not limited to this. In some embodiments, some of the connecting electrodes CNE may be directly connected to a third conductive layer. For example, the first and second connecting electrodes CNE1 and CNE2, which are first-type (e.g., first set of) connecting electrodes, may be directly connected to the third conductive layer and may not be electrically connected to the electrodes RME. Second-type (e.g., second set of) connecting electrodes and third-type (e.g., third set of) connecting electrodes may not be electrically connected, but may be connected only to the light-emitting elements ED.

The first and second connecting electrodes CNE1 and CNE2 may be first-type connecting electrodes connected to electrodes RME (e.g., the first and second electrodes RME1 and RME2) that are directly connected to the third conductive layer, the third and fourth connecting electrodes CNE3 and CNE4 may be second-type connecting electrodes connected to electrodes RME (e.g., the third and fourth electrodes RME3 and RME4) that are not connected to the third conductive layer, and the fifth connecting electrode CNE5 may be a third-type connecting electrode connected to none of the electrodes RME. The fifth connecting electrode CNE5 may not be connected to the electrodes RME and may be in contact with the light-emitting elements ED to form electrical connections for the light-emitting elements ED together with the other connecting electrodes CNE.

The third and fourth connecting electrodes CNE3 and CNE4, which are second-type connecting electrodes, may have extensions extending in the first direction DR1, but not in parallel to each other in the second direction DR2, and the fifth connecting electrode CNE5, which is a third-type connecting electrode, may have extensions extending in the first direction DR1 and in parallel to each other in the second direction DR2. The third and fourth connecting electrodes CNE3 and CNE4 may be bent while generally extending in the first direction DR1, and the fifth connecting electrode CNE5 may surround portions of the third and fourth connecting electrodes CNE3 and CNE4.

The light-emitting elements ED may be classified into different groups of light-emitting elements depending on which of the connecting electrodes CNE they are each in contact with. First end portions of the first light-emitting elements ED1 and first end portions of the second light-emitting elements ED2 may each be in contact with a first-type connecting electrode, and second end portions of the first light-emitting elements ED1 and second end portions of the second light-emitting elements ED2 may each be in contact with a second-type connecting electrode. The first light-emitting elements ED1 may be in contact with the first and third connecting electrode CNE1 and CNE3, and the second light-emitting elements ED2 may be in contact with the second and fourth connecting electrodes CNE2 and CNE4. First end portions of the third light-emitting elements ED3 and first end portions of the fourth light-emitting elements ED4 may each be in contact with a second-type connecting electrode, and second end portions of the third light-emitting elements ED3 and second end portions of the fourth light-emitting elements ED4 may each be in contact with third-type connecting electrodes. The third light-emitting elements ED3 may be in contact with the third and fifth connecting electrodes CNE3 and CNE5, and the fourth light-emitting elements ED4 may be in contact with the fourth and fifth connecting electrodes CNE4 and CNE5.

The light-emitting elements ED may be connected in series through the connecting electrodes CNE. As a relatively large number of light-emitting elements ED are provided in each subpixel SPXn to form serial connections therebetween, the amount of light emitted per unit area can be further increased.

Figure 20:
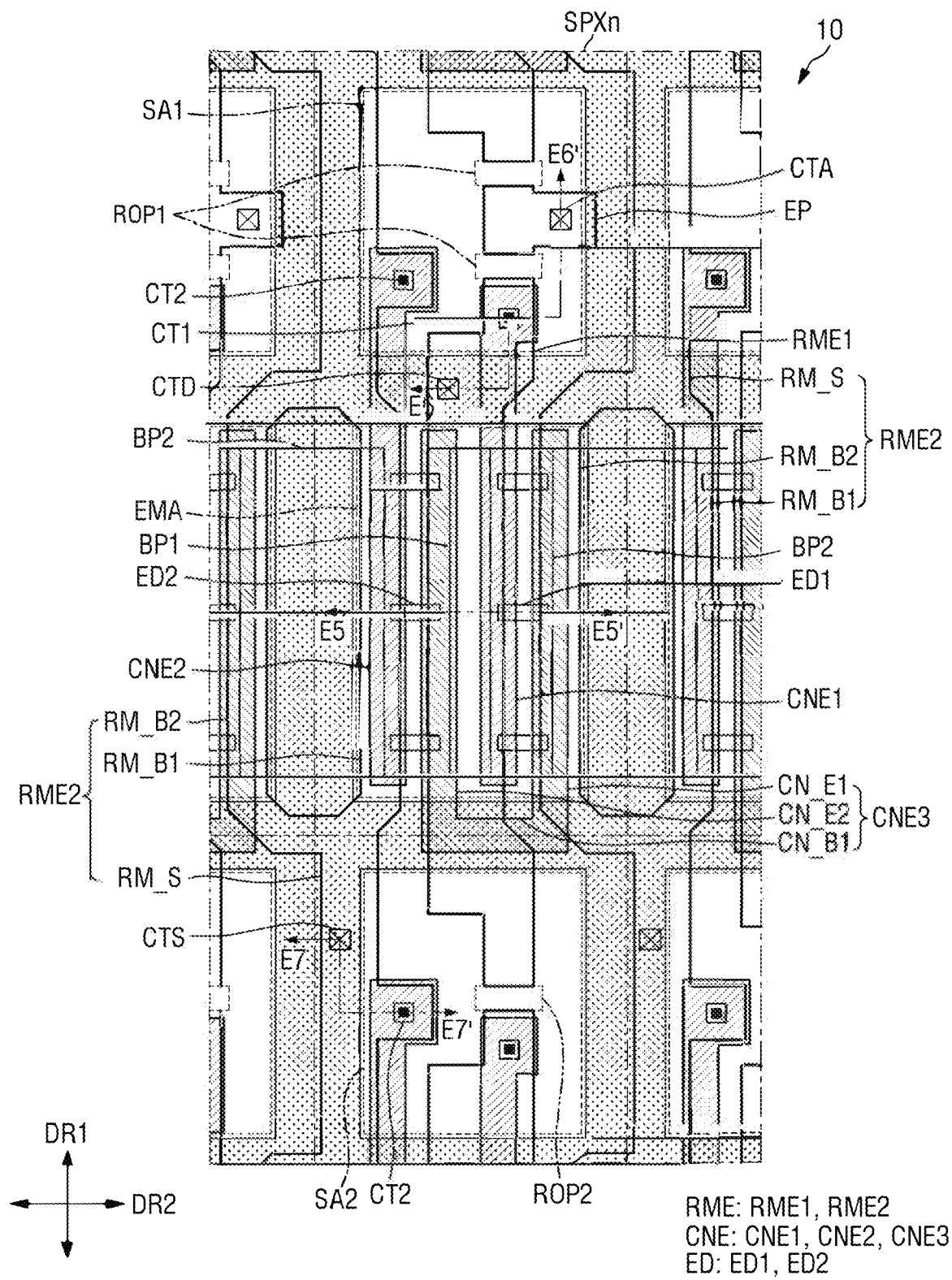
FIG. 20 is a plan view of a subpixel of a display device according to one or more other embodiments of the present disclosure.
Figure 21:
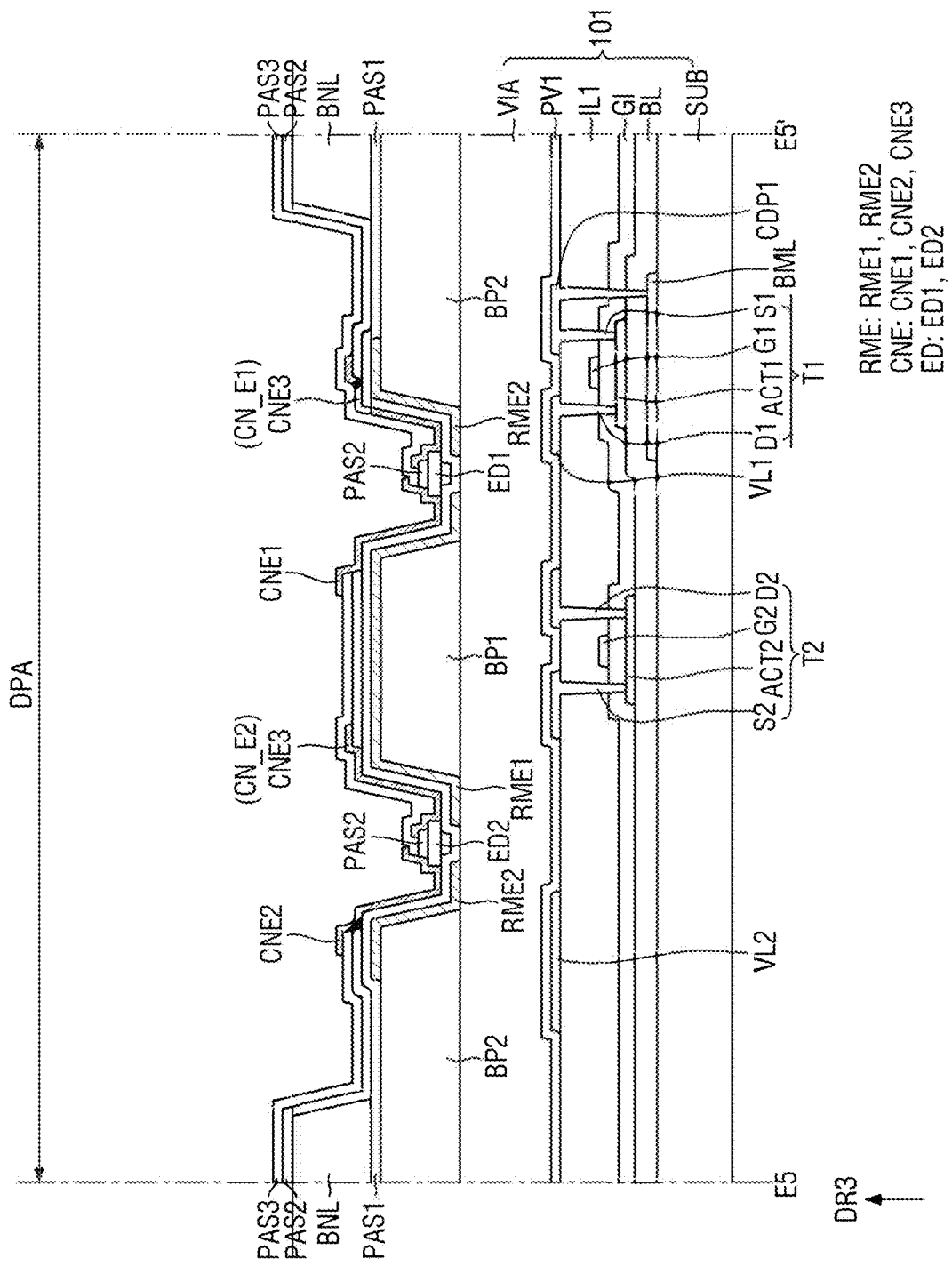
FIG. 21 is a cross-sectional view taken along line E5-E5' of FIG. 20.
Figure 22:
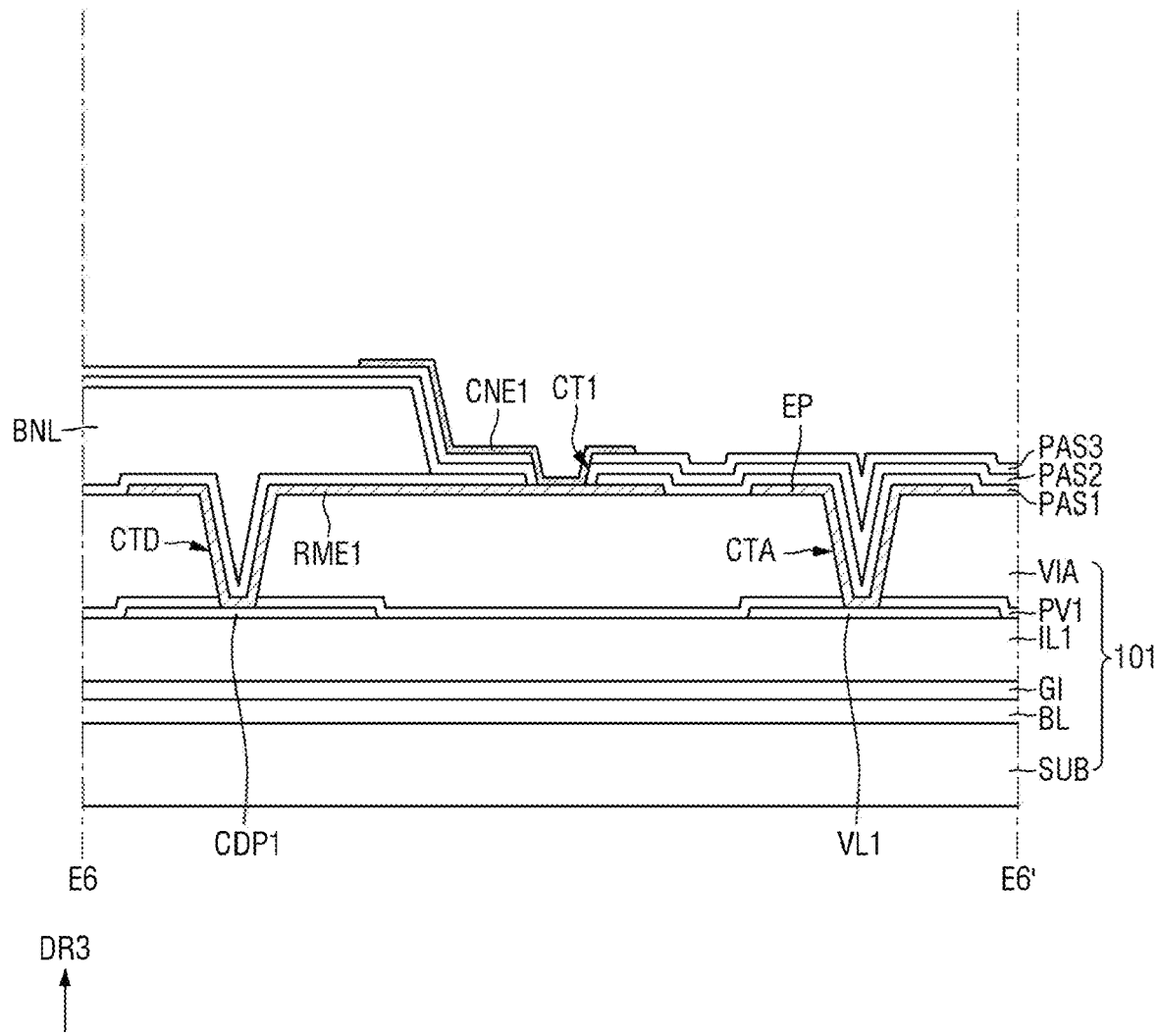
FIG. 22 is a cross-sectional view taken along line E6-E6' of FIG. 20.
Figure 23:
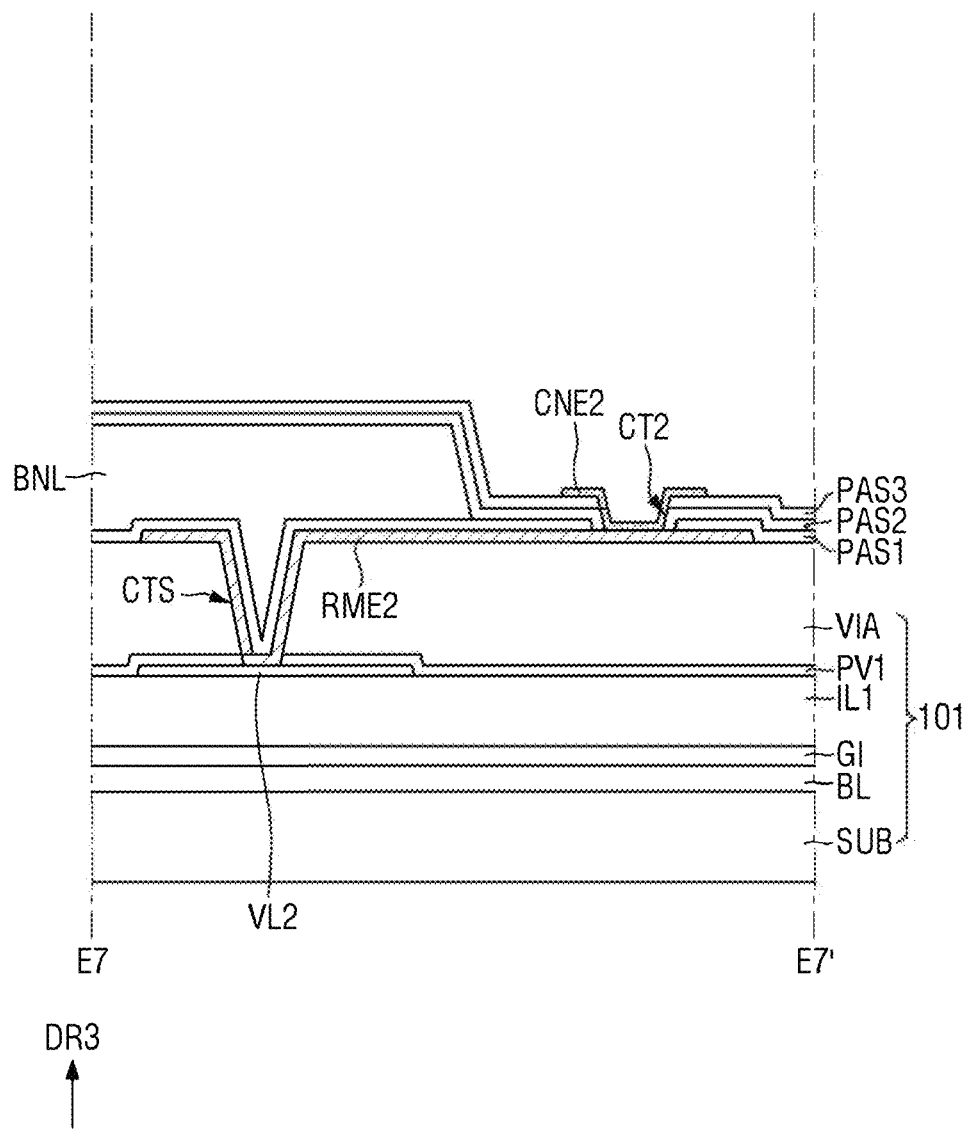
FIG. 23 is a cross-sectional view taken along line E7-E7' of FIG. 20.

FIG. 20 is a plan view of a subpixel of a display device according to one or more other embodiments of the present disclosure. FIG. 21 is a cross-sectional view taken along line E5-E5' of FIG. 20. FIG. 22 is a cross-sectional view taken along line E6-E6' of FIG. 20. FIG. 23 is a cross-sectional view taken along line E7-E7' of FIG. 20.

FIG. 20 illustrates the layout of electrodes RME, bank patterns (BP1 and BP2), a bank layer BNL, a plurality of light-emitting elements ED, and connecting electrodes CNE in a pixel PX of a display device 10. FIG. 21 illustrates a cross-sectional view taken across both end portions of each of light-emitting elements ED on different electrodes RME. FIGS. 22 and 23 illustrate cross-sectional views taken across first, second, and third electrode contact holes CTD, CTS, and CTA and contacts (CT1 and CT2).

The embodiment of FIG. 20 differs from the previous embodiments in the structures of the electrodes RME, the connecting electrodes CNE, and the bank patterns (BP1 and BP2). The embodiment of FIG. 20 will hereinafter be described, focusing mainly on the differences relative to the previous embodiments.

Referring to FIGS. 20 through 23, the bank patterns (BP1 and BP2) may extend in a first direction DR1 and may have different widths in a second direction DR2, and one of the bank patterns (BP1 and BP2) may be provided in a pair of adjacent subpixels SPXn in the second direction DR2. For example, the bank patterns (BP1 and BP2) may include a first bank pattern BP1 and second bank patterns BP2, which are provided over emission areas EMA of two different subpixels SPXn.

The first bank pattern BP1 may be provided in the middle of an emission area EMA of a subpixel SPXn of FIG. 20, and the second bank patterns BP2 may be spaced apart from each other with the first bank pattern BP1 interposed therebetween. The first bank pattern BP1 and the second bank patterns BP2 may be alternately arranged in the second direction DR2. Light-emitting elements ED may be provided between the first bank pattern BP1 and the second bank patterns BP2.

The first bank pattern BP1 and the second bank patterns BP2 may have the same length in the first direction DR1 and may have different widths in the second direction DR2. Portions of the bank layer BNL that extend in the first direction DR1 may overlap with the second bank patterns BP2 in a thickness direction. The first bank pattern BP1 may be provided to overlap with a first electrode RME1, and the second bank patterns BP2 may be provided to overlap with electrode branches (RM_B1 and RM_B2) of second electrodes RME2 and the bank layer BNL.

The first bank pattern BP1 and the second bank patterns BP2 may have the same length in the first direction DR1 and may have different widths in the second direction DR2. Portions of the bank layer BNL that extend in the first direction DR1 may overlap with the second bank patterns BP2 in the thickness direction. The bank patterns (BP1 and BP2) may be arranged as island patterns over the entire surface of a display area DPA.

The electrodes RME may include a first electrode RME1, which is provided in the middle of the subpixel SPXn, and second electrodes RME2, which are provided not only in the subpixel SPXn, but also in other subpixels SPXn. The first electrode RME1 and the second electrodes RME2 may generally extend in a first direction DR1 and may have different shapes in an emission area EMA.

The first electrode RME1 may be provided in the middle of the subpixel SPXn, and portion of the first electrode RME1 in an emission area EMA may be provided on a first bank pattern BP1. The first electrode RME1 may extend in the first direction DR1 from a first subarea SA1 of the subpixel SPXn to a second subarea SA2 of another subpixel SPXn. The width, in a second direction DR2, of the first electrode RME1 may vary, and at least portion of the first electrode RME1 that overlaps with the first bank pattern BP1, in the emission area EMA, may have a larger width than the first bank pattern BP1.

The second electrodes RME2 may include parts that extend in the first direction DR1 and parts that branch off near the emission areas EMA. For example, the second electrodes RME2 may include electrode stems RM_S, which extend in the first direction DR1, and electrode branches (RM_B1 and RM_B2), which branch off of the electrode stems RM_S to be bent in the second direction DR2 and extend back (e.g., again) in the first direction DR1. The electrode stems RM_S may be provided on sides, in the second direction DR2, of the first subarea SA1 to overlap with portions of the bank layer BNL that extend in the first direction DR1. The electrode branches (RM_B1 and RM_B2) may branch off of the electrode stems RM_S, which are provided not only on the portions of the bank layer BNL that extend in the first direction DR1, but also on portions of the bank layer BNL that extend in the second direction DR2, and may be bent from both sides, in the second direction DR2, of their respective electrode stems RM_S. The electrode branches (RM_B1 and RM_B2) may be arranged along the first direction DR1 over two different emission areas EMA and may then be bent to be incorporated into, and connected to, the electrode stems RM_S. For example, the electrode branches (RM_B1 and RM_B2) may branch off of the electrode stems RM_S, above the emission area EMA, and may be connected together, below the emission area EMA.

The electrode branches (RM_B1 and RM_B2) may include first and second electrode branches RM_B1 and RM_B2, which are provided on the left and right sides, respectively, of the first electrode RME1. A set of electrode branches (RM_B1 and RM_B2) of one second electrode RME2 may be provided in emission areas EMA of two adjacent subpixels SPXn in the second direction DR2, and electrode branches (RM_B1 and RM_B2) from two different second electrodes RME2 may be provided in one subpixel SPXn. The first electrode branch RM_B1 of the subpixel SPXn of FIG. 20 may be provided on the left side of the first electrode RME1, and the second electrode branch RM_B2 of the subpixel SPXn of FIG. 20 may be provided on the right side of the first electrode RME1.

The electrode branches (RM_B1 and RM_B2) may overlap with sides of second bank patterns BP2. The first electrode branch RM_B1 may partially overlap with a second bank pattern BP2 on the left side of the first bank pattern BP1, and the second electrode branch RM_B2 may partially overlap with a second bank pattern BP2 on the right side of the first bank pattern BP1. The first electrode RME1 may be spaced apart from, and face, two different electrode branches (RM_B1 and RM_B2) of two different electrodes RME2, and the distance between the first electrode RME1 and the electrode branches (RM_B1 and RM_B2) may be less than the distance between the bank patterns (BP1 and BP2).

The width, in the first direction DR2, of the first electrode RME1 may be greater than the widths of the electrode stem RM_S and the electrode branches (RM_B1 and RM_B2). The first electrode RME1 may have a greater width than the first bank pattern BP1 and may cover both side surfaces of the first bank pattern BP1. In one or more embodiments, the second electrodes RME2 may be formed to have a relatively small width, and thus, the electrode branches (RM_B1 and RM_B2) may overlap with only one side surface of their respective second bank patterns BP2.

The first electrode RME1 may be in contact with a first conductive pattern CDP1 of a third conductive layer through the first electrode contact hole CTD, in an area that overlaps with the portion of the bank layer BNL that extends in the second direction DR2. The electrode stem RM_S may be in contact with a second voltage line VL2 of the third conductive layer through the second electrode contact hole CTS. Portion of the first electrode RME1 that is provided in the first subarea SA1 may overlap with a first contact CT1. Each of the second electrodes RME2 may include protruding parts that protrude in the second direction DR2 from the electrode stem RM_S to be provided in different subareas SA, and each of the protruding portions of each of the second electrodes RME2 may overlap with a second contact CT2.

The first electrode RME1 may be disconnected (e.g., broken up, patterned) in the first subarea SA1 by first separation parts ROP1 and in a second subarea SA2 by a separation part ROP2, but the second electrodes RME2 may not be disconnected (e.g., broken up, patterned) in the subareas SA1 and SA2. Each of the second electrodes RME2 may include a plurality of electrode stems RM_S and a plurality of sets of electrode branches (RM_B1 and RM_B2) and may extend in the first direction DR1, and the second electrodes RME2 may branch off near the emission area EMA of each subpixel SPXn. The first electrode RME1 may be provided between separation parts ROP of two different subareas SA, e.g., between one of the first separation parts ROP1 of the first subarea SA1 and the second separation part ROP2 of the second subarea SA2, across the emission area EMA of the subpixel SPXn of FIG. 20.

The display device 10 may further include, in the subpixel SPXn of FIG. 20, a wiring connecting electrode EP, which is provided in the first subarea SA1, between the first electrode RME1 and a first electrode RME1 of another subpixel SPXn. No wiring connecting electrode EP may be provided in the second subarea SA, and the first electrode RME1 of the subpixel SPXn may be spaced apart from a first electrode RME1 of a lower neighboring subpixel SPXn, in the first direction DR1, of the subpixel SPXn. In the subpixel SPXn of FIG. 20, the first subarea SA1 where the wiring connecting electrode EP is provided may be arranged on the upper side of the emission area EMA, and the second subarea SA2 may be provided on the lower side of the emission area EMA. In the lower neighboring subpixel SPXn of the subpixel SPXn of FIG. 20, the first subarea SA1 where the wiring connecting electrode EP is provided may be arranged on the lower side of the emission area EMA, and the second subarea SA2 may be provided on the upper side of the emission area EMA.

The first electrode RME1 may be spaced apart from the wiring connecting electrode EP by one of the first separation parts ROP1 in the first subarea SA1. Two first separation parts ROP1 may be provided in the first subarea SA1, and the wiring connecting electrode EP may be spaced apart from the first electrode RME1 by the lower first separation part ROP1, and may be spaced apart from a first electrode RME1 of an upper neighboring subpixel SPXn, in the first direction DR1, of the subpixel SPXn of FIG. 20 by the upper first separation part ROP1. Only one second separation part ROP2 may be provided in the second subarea SA2, and different first electrodes RME1 may be spaced apart from one another in the first direction DR1.

The wiring connecting electrode EP may be connected to a first voltage line VL1 of the third conductive layer through the third electrode contact hole CTA, which penetrates a via layer VIA and a first passivation layer PV1. The first electrode RME1 may be formed to be connected to the wiring connecting electrode EP, and an electrical signal for arranging light-emitting elements ED may be applied from the first voltage line VL1 to the first electrode RME1 through the wiring connecting electrode EP. The arrangement of the light-emitting elements ED may be performed by applying signals to the first and second voltage lines VL1 and VL2, and the signals may then be transmitted to the first electrode RME1 and the second electrodes RME2.

The second and third electrode contact holes CTS and CTA may have different layouts. The second electrode contact hole CTS may be provided in a portion of the bank layer BNL that surrounds the second subarea SA, and the third electrode contact hole CTA may be provided in the first subarea SA1. The locations of the second and third electrode contact holes CTS and CTA may be determined in consideration that the second and third electrode contact holes CTS and CTA expose the top surfaces of different voltage lines.

The bank layer BNL may surround the emission area EMA and the first and second areas SA1 and SA2. In one or more embodiments where two separate subareas, e.g., the first and second subareas SA1 and SA2, are provided, areas surrounded by the bank layer BNL may be distinguished from one another. The bank layer BNL is the same as its counterpart of any one of the previous embodiments, except that it surrounds different subareas, e.g., the first and second subareas SA1 and SA2.

The light-emitting elements ED may be provided on different electrodes RME, between different bank patterns (BP1 and BP2). The light-emitting elements ED may include first light-emitting elements ED1, which are provided between the first electrode RME1 and the second electrode branch RM_B2 of one of the second electrode RME2, and second light-emitting elements ED2, which are provided on the first electrode RME1 and the first electrode branch RM_B1 of the other second electrode RME2. The first light-emitting elements ED1 may be provided on the right side of the first electrode RME1, and the second light-emitting elements ED2 may be provided on the left side of the first electrode RME1. The first light-emitting elements ED1 may be provided on the first electrode RME1 and one of the second electrodes RME2, and the second light-emitting elements ED2 may be provided on the first electrode RME1 and the other second electrode RME2.

The connecting electrodes CNE may include first through third connecting electrodes CNE1 through CNE3.

The first connecting electrode CNE1 may extend in the first direction DR1 and may be provided on the first electrode RME1. Portion of the first connecting electrode CNE1 on the first bank pattern BP1 may overlap with the first electrode RME1, and the first connecting electrode CNE1 may extend in the first direction DR1 from its part overlapping with the first electrode RME1, beyond the bank layer BNL, and may thus be provided even in the first subarea SA1, which is provided on the upper side of the emission area EMA. The first connecting electrode CNE1 may be in contact with the first electrode RME1 through the first contact CT1 in the first subarea SA1.

The second connecting electrode CNE2 may extend in the first direction DR1 and may be provided on one of the second electrodes RME2, e.g., on the left second electrode RME2. Portion of the second connecting electrode CNE2 on the left second bank pattern BP2 may overlap with the left second electrode RME2, and the second connecting electrode CNE2 may extend in the first direction DR1 from its part overlapping with the left second electrode RME2, beyond the bank layer BNL, and may thus be provided even in the first subarea SA1, which is provided on the upper side of the emission area EMA. The second connecting electrode CNE2 may be in contact with the left second electrode RME2 through the second contact CT2 in the first subarea SA1.

The first and second connecting electrodes CNE1 and CNE2 may be in contact with the first electrode RME1 and one of the second electrodes RME2, respectively, through first and second contacts CT1 and CT2, respectively, in the second subarea SA2.

The third connecting electrode CNE3 may include first and second extensions CN_E1 and CN_E2, which extend in the first direction DR1, and a first connector CN_B1, which connects the first and second extensions CN_E1 and CN_E2. The first extension CN_E1 may face the first connecting electrode CNE1, in the emission area EMA, and may be provided on the second electrode branch RM_B2 of the right second electrode RME2, and the second extension CN_E2 may face the second connecting electrode CNE2, in the emission area EMA, and may be provided on the first electrode RME1. The first connector CN_B1 may extend in the second direction DR2 on portion of the bank layer BNL on the lower side of the emission area EMA to connect the first and second extensions CN_E1 and CN_E2. The third connecting electrode CNE3 may be provided on the emission area EMA and on the bank layer BNL and may not be directly connected to the electrodes RME. The second electrode branch RM_B2 below the first extension CN_E1 may be electrically connected to the second voltage line VL2, and a second power supply voltage applied to the second electrode branch RM_B2 may not be transmitted to the third connecting electrode CNE3.

In concluding the detailed description, those skilled in the art will appreciate that many variations and modifications can be made to the embodiments described herein without substantially departing from the principles of the present disclosure as set forth in the following claims and their equivalents. Therefore, the disclosed embodiments of the present disclosure are used in a generic and descriptive sense only and not for purposes of limitation.

What is claimed is:

1. A display device comprising:
    a first substrate comprising a display area and a pad area on one side of the display area;
    a plurality of conductive layers, each of the plurality of conductive layers comprising a plurality of wires and conductive patterns, which are in the display area and the pad area, on the first substrate;
    a via layer on the plurality of conductive layers;
    a first electrode and a second electrode on the via layer, in the display area, to be spaced apart from each other;
    a first insulating layer on the first electrode and the second electrode;
    a plurality of light-emitting elements on the first electrode and the second electrode, and on the first insulating layer; and
    a first connecting electrode on the first electrode and in contact with the plurality of light-emitting elements, and a second connecting electrode on the second electrode and in contact with the plurality of light-emitting elements,
    wherein at least one of the plurality of conductive layers comprises a metal layer comprising a copper-silver (CuAg) alloy and having a crystal grain size of 140 nm or less.

2. The display device of claim 1, wherein the metal layer has a specific resistivity of 2.3 $\mu\Omega$cm or less.

3. The display device of claim 1, wherein the metal layer has an Ag content of 3 at % or less.

4. The display device of claim 3, wherein the metal layer has an Ag content of 1 at % or less.

5. The display device of claim 1, wherein the metal layer has a thickness of 2,000 Å to 20,000 Å.

6. The display device of claim 5, wherein the metal layer has a thickness of about 8,000 Å and a surface resistivity of 0.02 $\Omega$/square to 0.03 $\Omega$/square.

7. The display device of claim 5, wherein the metal layer has a thickness of about 3,000 Å and a surface resistivity of 0.06 $\Omega$/square to 0.08 $\Omega$/square.

8. The display device of claim 1, wherein the metal layer has a line edge roughness (LER) of 0.195 $\mu$m or less.

9. The display device of claim 1, wherein the plurality of conductive layers comprise
    a first conductive layer, which comprises a lower metal layer in the display area and a first pad wire in the pad area,
    a second conductive layer, which is on the first conductive layer and comprises a plurality of gate electrodes in the display area and a second pad wire in the pad area, and
    a third conductive layer, which is on the second conductive layer and comprises a first conductive pattern in the display area and a pad electrode lower layer in the pad area, and
    wherein the via layer is on the third conductive layer, in the display area.

10. The display device of claim 9, further comprising:
    a first gate insulating layer between the first conductive layer and the second conductive layer;
    a first interlayer insulating layer between the second conductive layer and the third conductive layer;
    a first passivation layer on the third conductive layer;
    a pad electrode upper layer on the pad electrode lower layer, in the pad area; and
    a pad electrode capping layer on the pad electrode upper layer,
    wherein the first gate insulating layer, the first interlayer insulating layer, and the first passivation layer comprise an inorganic insulating material.

11. The display device of claim 10, wherein
    the pad electrode upper layer comprises the same material as the first electrode and the second electrode, and
    the pad electrode capping layer comprises the same material as the first connecting electrode and the second connecting electrode.

12. The display device of claim 10, wherein
    the plurality conductive layers further comprise a fourth conductive layer, which is on the third conductive layer and comprises a first voltage line and a second voltage line, and
    the display device further comprises a second interlayer insulating layer on the first passivation layer, and a second passivation layer on the fourth conductive layer.

13. The display device of claim 12, wherein
    the via layer comprises a trench, which exposes a portion of a top surface of the second passivation layer,
    at least portions of the first electrode and the second electrode are directly on the second passivation layer, in the trench, and
    the plurality of light-emitting elements are in the trench.

14. A wiring substrate comprising:
    a plurality of conductive layers, each of the plurality of conductive layers comprising a plurality of wires and conductive patterns, which are on a substrate; and
    at least one insulating layer between respective ones of the plurality of conductive layers,
    wherein at least one of the plurality of conductive layers comprises a metal layer comprising a copper-silver (CuAg) alloy and having a crystal grain size of 140 nm or less and a specific resistivity of 2.3 μΩcm or less.

15. The wiring substrate of claim 14, wherein the metal layer has an Ag content of 3 at % or less.

16. The wiring substrate of claim 15, wherein the metal layer has an Ag content of 1 at % or less.

17. The wiring substrate of claim 14, wherein the metal layer has a thickness of 2,000 Å to 20,000 Å.

18. The wiring substrate of claim 17, wherein the metal layer has a thickness of about 8000 Å and a surface resistivity of 0.02 Ω/square to 0.03 Ω/square.

19. The wiring substrate of claim 17, wherein the metal layer has a thickness of about 3000 Å and a surface resistivity of 0.06 Ω/square to 0.08 Ω/square.

20. The wiring substrate of claim 14, wherein the metal layer has a line edge roughness (LER) of 0.195 μm or less.

* * * * *